(12) United States Patent
Ooishi

(10) Patent No.: US 6,514,834 B2
(45) Date of Patent: *Feb. 4, 2003

(54) METHOD OF MANUFACTURING A SEMICONDUCTOR DEVICE HAVING A LOW LEAKAGE CURRENT

(75) Inventor: Tsukasa Ooishi, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/373,604

(22) Filed: Aug. 13, 1999

(65) Prior Publication Data

US 2001/0012669 A1 Aug. 9, 2001

Related U.S. Application Data

(62) Division of application No. 08/852,812, filed on May 7, 1997, which is a division of application No. 08/725,387, filed on Oct. 3, 1996, now Pat. No. 5,656,853, which is a continuation of application No. 08/571,581, filed on Dec. 13, 1995, now abandoned, which is a continuation of application No. 08/293,268, filed on Aug. 19, 1994, now abandoned.

(30) Foreign Application Priority Data

Mar. 14, 1994 (JP) .................................. 6-42240

(51) Int. Cl.$^7$ ............... H01L 21/76; H01L 21/8238; H01L 21/336; H01L 23/58; H01L 23/48

(52) U.S. Cl. ............... 438/443; 438/453; 438/218; 438/225; 438/233; 438/297; 257/647; 257/774; 257/305

(58) Field of Search ................. 438/238, 279, 438/262, 44, 233, 453, 218, 225, 297, 199; 257/647, 774, 305, 296

(56) References Cited

U.S. PATENT DOCUMENTS

| 4,101,344 A | * 7/1978 | Kooi et al. ............ 148/1.5 |
| 4,277,881 A | 7/1981 | Godejahn, Jr. .......... 29/571 |

(List continued on next page.)

FOREIGN PATENT DOCUMENTS

| JP | 2-291166 | 11/1990 |
| JP | 3-102869 | 4/1991 |
| JP | 3-211775 | 9/1991 |
| JP | 5-211131 | 8/1993 |

OTHER PUBLICATIONS

Akihiro, Nakamura; translated by FLS, Inc.; Japn Patent (JP 03211775 A); Pub. Sep. 17, 1991; Translated Oct. 2000; pp. 1–25, and 510–511.*

(List continued on next page.)

Primary Examiner—Wael Fahmy
Assistant Examiner—Neal Berezny
(74) Attorney, Agent, or Firm—McDermott, Will & Emery

(57) ABSTRACT

A field oxide film is provided in the surface of a semiconductor substrate. An interlayer insulating film is provided on the semiconductor substrate so as to cover an active layer. A contact hole exposing the surface of the active layer is provided in the interlayer insulating film. A conductor fills the contact hole so as to be electrically connected to the surface of the active layer. The end portion of the field oxide film has a surface perpendicular with respect to the surface of the semiconductor substrate. As a result, a dynamic random access memory can be obtained which is improved so that leakage current is reduced, which in turn increases a hold time of information.

1 Claim, 27 Drawing Sheets

U.S. PATENT DOCUMENTS

| | | | |
|---|---|---|---|
| 4,549,914 A | | 10/1985 | Oh .............................. 148/187 |
| 4,551,911 A | * | 11/1985 | Sasaki et al. ............. 29/576 W |
| 4,722,910 A | * | 2/1988 | Yasaitis ....................... 437/44 |
| 4,764,248 A | | 8/1988 | Bhattacherjee et al. ...... 156/643 |
| 4,903,107 A | | 2/1990 | Wei ............................ 357/49 |
| 4,933,742 A | | 6/1990 | Brown et al. ................. 357/71 |
| 4,980,748 A | | 12/1990 | Hozumi et al. ............... 357/50 |
| 5,057,902 A | | 10/1991 | Haskell ........................ 357/71 |
| 5,065,222 A | | 11/1991 | Ishii ............................ 357/52 |
| 5,070,386 A | | 12/1991 | Imura .......................... 357/52 |
| 5,168,343 A | | 12/1992 | Sakamoto ................... 257/513 |
| 5,208,470 A | | 5/1993 | Lee et al. .................... 257/296 |
| 5,248,891 A | | 9/1993 | Takato et al. ............... 257/309 |
| 5,334,869 A | | 8/1994 | Iguchi et al. ............... 257/309 |
| 5,512,778 A | * | 4/1996 | Chung et al. ............... 257/629 |

OTHER PUBLICATIONS

Akihiro, N.; translated by FLS, Inc.; Oct. 2000; JP 030211775.*

Wolf, S.; Tauber, R. N.; Silicon Processing For the VLSI Era: vol. 1; Lattice Press; Sunset Beach, Ca.; 1986; pp. 187–189.*

Wolf, S.; Silicon Processing for the VLSI Era: vol. 2; Lattice Press; Sunset Beach, Ca.; 1990; pp. 41–42.*

Bohg, A.; Gaind, A. K.; "Influence of film stress and thermal oxidation on the generation of dislocations in silicon", Applied Physics Letters, vol. 33, No. 10; Nov. 15, 1978; pp. 895–897.*

* cited by examiner

METHOD OF MANUFACTURING A SEMICONDUCTOR DEVICE HAVING A LOW LEAKAGE CURRENT

This application is a divisional of application Ser. No. 08/852,812 filed May 7, 1997, which is a divisional of application Ser. No. 08/725,387 filed Oct. 3, 1996, now U.S. Pat. No. 5,656,853, which is a continuation of application Ser. No. 08/571,581 filed Dec. 13, 1995, now abandoned, which is a continuation of application Ser. No. 08/293,268 filed Aug. 19, 1994, now abandoned.

BACKGROUND OF THE INVENTION

1. Field of the Invention

The present invention generally relates to semiconductor devices, and more particularly, to a semiconductor device improved so that leak current can be reduced.

The present invention further relates to a method of manufacturing such a semiconductor device.

2. Description of the Background Art

FIG. 52 is a circuit diagram of a memory array of a conventional dynamic random access memory (DRAM). FIG. 53 is a diagram showing waveforms of array operation of the conventional DRAM.

Referring to these figures, a memory cell array of the conventional DRAM includes a word line (WL), a bit line (BL), a bit line isolation (BLI), a sense drive line (SN), a bit line precharge (VBL), a restore drive line (SP), a memory cell, an N channel-sense amplifier (Nch-SA), an equalizer, and a P channel-restore amplifier (Pch-RA).

Information is stored in the memory cell. A place in which reading/writing is to be carried out is designated by selection of a word line. Reading.or writing is carried out by selection of a specified bit line.

FIG. 54 is a sectional view of the memory cell of the conventional DRAM. In the surface of a P-type semiconductor substrate 1, provided is a field oxide film 2 which isolates an active region 3 from other active regions with its end portion 2a surrounding active region 3. An active layer 4 which is an impurity diffusion layer is provided in the surface of active region 3. A gate electrode (word line) 5 is provided on active region 3. An interlayer insulating film 6 is provided on semiconductor substrate 1 so as to cover gate electrode 5. A contact hole 7 exposing the surface of active layer 4 is provided in interlayer insulating film 6. Contact hole 7 is filled with a storage node B which is a conductor is electrically connected to the surface of active layer 4. The surface of storage node 8 is covered with a dielectric film 9. A cell plate electrode 10 is provided so as to cover storage node 8 with dielectric film 9 interposed therebetween. A bit line 12 is connected to an active layer 11.

In the memory cell of the DRAM, information is held by storing charge in dielectric film 9 sandwiched by storage node 8 and cell plate 10.

The stored charge leaks to decrease in accordance with time. When much of the stored charge leaks, accurate information cannot be read out, causing malfunction of the device.

Leakage current is mostly caused by defects in semiconductor substrate 1.

Description will be given of the leakage current in more detail.

FIG. 55 is a layout diagram of a DRAM. In FIG. 55, a contour 13 represents an end portion of a mask forming an active region, which will be described in more detail.

More specifically, referring to FIG. 57A, in order to form active region 3 on semiconductor substrate 1, a mask 14 of a silicon nitride film is formed on active region 3.

Referring to FIG. 57B, the surface of semiconductor substrate 1 is thermally oxidized using mask 14 to form field oxide film 2. At this time, an end portion of field oxide film 2 goes under mask 14 to form a bird's beak portion 22.

Referring to FIG. 57C, when mask 14 is removed, field oxide film 2 is formed which is divided into a body region 16 having an approximately constant thickness and a bird's beak region 15 having a thickness gradually decreased in the direction toward active region 3.

In FIG. 55, contour 13 represents an end portion 13 of mask 14. In other words, referring to FIGS. 55 and 57C, contour 13 represents the boundary between body region 16 and bird's beak region 15.

In FIG. 55, a contour 17 represents an opening portion of a resist mask for formation of a storage node contact hole, which will be described in more detail. More specifically, referring to FIG. 58A, in order to form a contact hole in interlayer insulating film 6, a resist mask 18 having a predetermined opening portion 17 is formed on interlayer insulating film 6. Referring to FIG. 58B, interlayer insulating film 6 is etched using resist mask 18 to form contact hole 7. Contour 17 represents an end portion of the above-described opening portion 17.

FIG. 56 is a sectional view of a memory cell taken in the same direction as the direction of the, 56—56 line in FIG. 55. Field oxide film 2 is formed in the surface of semiconductor substrate 1. Active layer 4 is formed in the surface of active region 3. Interlayer insulating film 6 is formed on semiconductor substrate 1 so as to cover active layer 4. Contact hole 7 exposing the surface of active layer 4 is formed in interlayer insulating film 6. Contact hole 7 is filled with storage node 8. A depletion layer 20 extends from active layer 4.

As described above, leakage current is mostly caused by a defect 21 in semiconductor substrate 1. Referring to FIG. 57B, when field oxide film 2 is formed in the surface of semiconductor substrate 1, much stress is applied directly under bird's beak portion 22. Therefore, a lot of defects 21 are formed in the vicinity of the boundary between bird's beak portion 22 and semiconductor substrate 1. Metal ions generated in the manufacturing process of a semiconductor device are trapped in defects 21. Referring to FIG. 56, when depletion layer 20 extending from active layer 4 comes in contact with defects 21, a leakage current component other than leakage current in the direction opposite to the case of a normal PN junction is added, which in turn rapidly decreases charge stored in the memory cell. This is a problem of the conventional DRAM.

SUMMARY OF THE INVENTION

One object of the present invention is to provide a semiconductor device which is improved so that leakage current can be suppressed.

Another object of the present invention is to provide a semiconductor device which is improved so that leakage current caused by a defect in a substrate can be suppressed.

Still another object of the present invention is to provide a dynamic random access memory which is improved so that a hold time of information can be increased.

A further object of the present invention is to provide a dynamic random access memory which is improved so that charge stored in a memory cell is not decreased.

A further object of the present invention is to provide a method of manufacturing the above-described semiconductor device.

The semiconductor device according to the first aspect of the present invention includes a semiconductor substrate. On the semiconductor substrate, provided is a field oxide film which isolates an active region from other active regions; with its end portion surrounding the active region. An interlayer insulating film is provided on the semiconductor substrate so as to cover the active region. A contact hole exposing a part of the surface of the active region is provided in the interlayer insulating film. The contact hole is filled with a conductor electrically connected to the surface of the active region. The end portion of the field oxide film has a surface perpendicular or approximately perpendicular with respect to the surface of the semiconductor substrate.

The semiconductor device according to the second aspect of the present invention includes a semiconductor substrate. On the semiconductor substrate, provided is a field oxide film which isolates an active region from other active regions with its end portion surrounding the active region. An active layer is provided in the surface of the active region. An interlayer insulating film is provided on the semiconductor substrate so as to cover the active region. A contact hole exposing the surface of the active layer is provided in the interlayer insulating film. The contact hole is filled with a conductor in contact with the active layer. The active layer is spaced from the end portion of the field oxide film so as not to be in contact with the end portion of the field oxide film.

The semiconductor device according to the third aspect of the present invention includes a semiconductor substrate. A recessed portion is provided in a portion other than an active region in the surface of the semiconductor substrate. The recessed portion is filled with an insulating film formed with a chemical vapor deposition method for isolating the active region from other active regions. A gate electrode is provided on said active region. An interlayer insulating film is provided on the semiconductor substrate so as to cover the gate electrode. A contact hole exposing a part of the surface of the active region is provided in the interlayer insulating film. A conductor is provided on the semiconductor substrate so as to fill the contact hole.

In the method of manufacturing a semiconductor device according to the fourth aspect of the present invention, a field oxide film which isolates an active region from other active regions with its end portion surrounding the active region is formed in the surface of a semiconductor substrate. A gate electrode is formed on the active region. An interlayer insulating film is formed on the semiconductor substrate so as to cover the gate electrode. The interlayer insulating film is selectively etched to form a contact hole exposing a part of the surface of the active region in the interlayer insulating film. Simultaneously, the end portion of the field oxide film is etched away. The contact hole is filled with a conductor connected to the active region.

In the method of manufacturing a semiconductor device according to the fifth aspect of the present invention, a field oxide film which isolates an active region from other active regions with its end portion surrounding the active region is formed in the surface of a semiconductor substrate. The end portion of the field oxide film is etched away. An oxide-film which is to serve as a gate insulating film and a conductor layer which is to serve as a gate electrode are sequentially formed on the semiconductor substrate. By patterning the oxide film and the conductor layer, a gate insulating film and a gate electrode are formed. An interlayer insulating film is formed on the semiconductor substrate so as to cover the gate electrode. A contact hole exposing the surface of the active region is formed in the interlayer insulating film. The contact hole is filled with a conductor in contact with the surface of the active region.

In the method of manufacturing a semiconductor device according to the sixth aspect of the present invention, a recessed portion is formed in a portion other than an active region in the surface of a semiconductor substrate. The recessed portion is filled with an insulating film. A gate electrode is formed on the active region. An interlayer insulating film is formed on the semiconductor substrate so as to cover the gate electrode. A contact hole exposing a part of the surface of the active region is formed in the interlayer insulating film. The contact hole is filled with a conductor electrically connected to the surface of the active region.

According to the semiconductor device of the first aspect of the present invention, the end portion of the field oxide film has a surface perpendicular or approximately perpendicular with respect to the surface of the semiconductor substrate. Such a structure is obtained by etching away the end portion of the field oxide film in the direction perpendicular to the surface of the semiconductor substrate. By etching, the end portion of the field oxide film is removed, and simultaneously, many of the defects which exist directly under the end portion of the field oxide film are removed.

According to the semiconductor device of the second aspect of the present invention, the active layer is spaced from the end portion of the field oxide film so as not to come in contact with the end portion of the field oxide film. Therefore, the active region is not in contact with the defects which exist directly under the end portion of the field oxide film.

According to the semiconductor device of the third aspect of the present invention, the insulating film for isolating an active region from other active regions is formed with a chemical vapor deposition method. Therefore, stress applied to the substrate is reduced, resulting in generation of no defects directly under the insulating film.

According to the method of manufacturing a semiconductor device of the fourth aspect of the present invention, the end portion of the field oxide film is simultaneously etched away when the contact hole is formed in the interlayer insulating film. When the end portion of the field oxide film is etched away, many of the defects which exist directly under the end portion of the field oxide film are removed.

According to the method of manufacturing a semiconductor device of the fifth aspect of the present invention, many of the defects which exist directly under the end portion of the field oxide film are simultaneously removed when the end portion of the field oxide film is etched away.

According to the method of manufacturing a semiconductor device of the sixth aspect of the present invention, a recessed portion is formed in a portion other than an active region. The recessed portion is filled with the insulating film. The active region is isolated from other active regions by the insulating film filling the recessed portion. When the recessed portion is filled with the insulating film, no stress is applied to the semiconductor substrate, resulting in generation of no defects under the insulating film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described with reference to the drawings.

Embodiment 1

Figure 1:
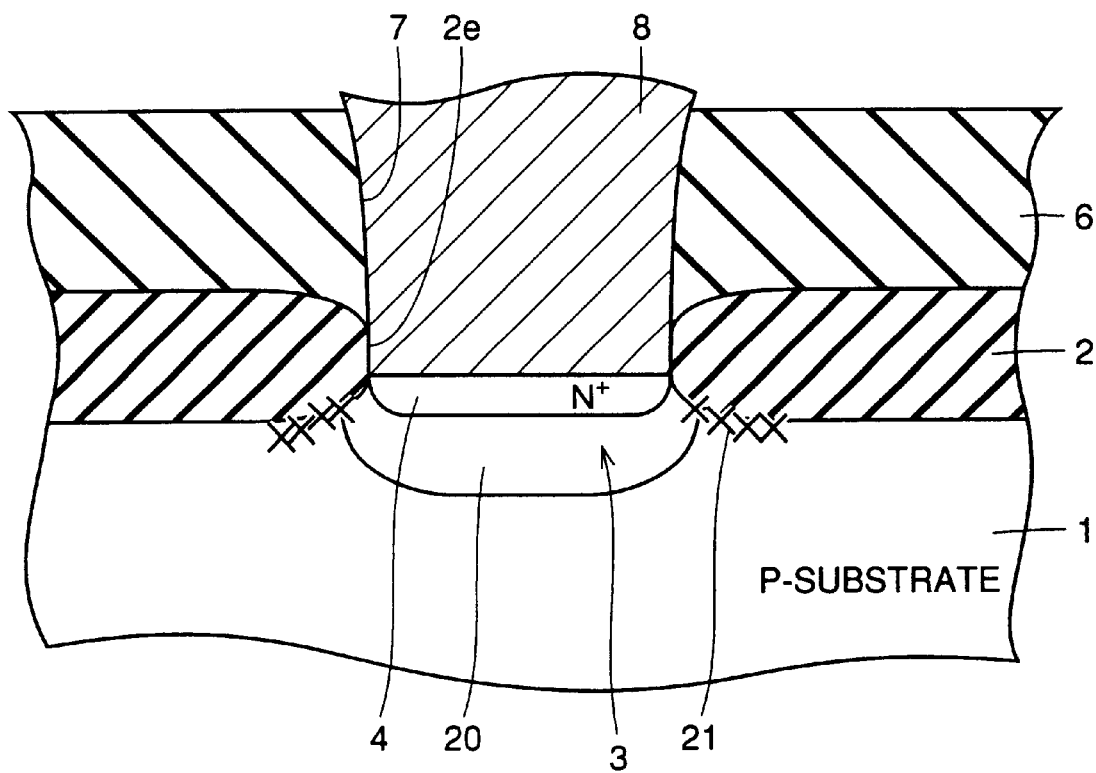
FIG. 1 is a sectional view of a semiconductor device according to Embodiment 1.

FIG. 1 is a sectional view of a semiconductor device according to one embodiment of the present invention.

The semiconductor device includes a P-type semiconductor substrate. Semiconductor substrate 1 is a silicon semiconductor substrate, for example. In the surface of semiconductor substrate 1, provided is a field oxide film 2 which isolates an active region 3 from other active regions with its end portion surrounding active region 3. An active layer 4 is provided in the surface of active region 3. A depletion layer 20 extends from active layer 4. An interlayer insulating film 6 is provided on semiconductor substrate 1 so as to cover active layer 4. A contact hole 7 exposing the surface of active layer 4 is provided in interlayer insulating film 6. A storage node 8 of a dynamic random access memory fills contact hole 7 so as to be electrically connected to the surface of active layer 4. In this embodiment, the end portion of field oxide film 2 has a surface 2e perpendicular to the surface of semiconductor substrate 1. The perpendicular surface 2e at the end portion of field oxide film 2 is obtained by etching away the end portion of field oxide film 2 in the direction perpendicular to the surface of semiconductor substrate 1, as will be described later. By this etching, many of defects 21 which exist directly under the end portion of field oxide film 2 are removed. Therefore, since the number of defects increasing leakage current is reduced, leakage current is decreased, resulting in a dynamic random access memory having an increased hold time of information.

Embodiment 2

Figure 2:
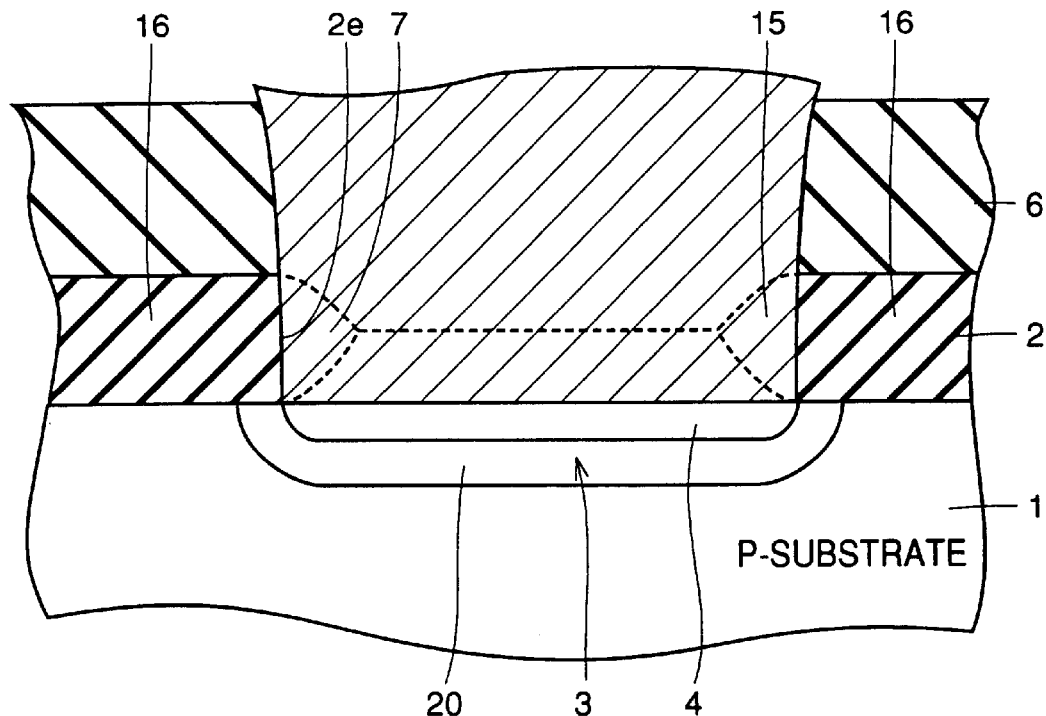
FIG. 2 is a sectional view of a semiconductor device according to Embodiment 2.
Figure 57A:
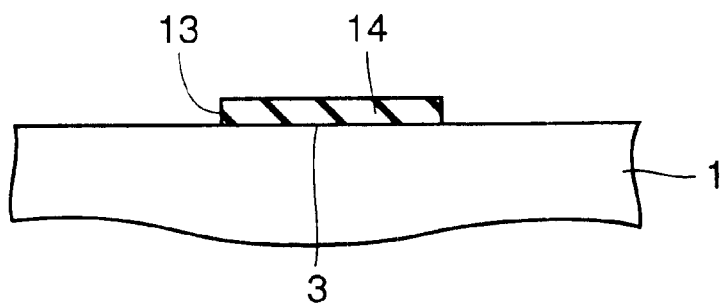
FIGS. 57A, 57B and 57C are diagrams showing a method of forming a conventional field oxide film.
Figure 57B:
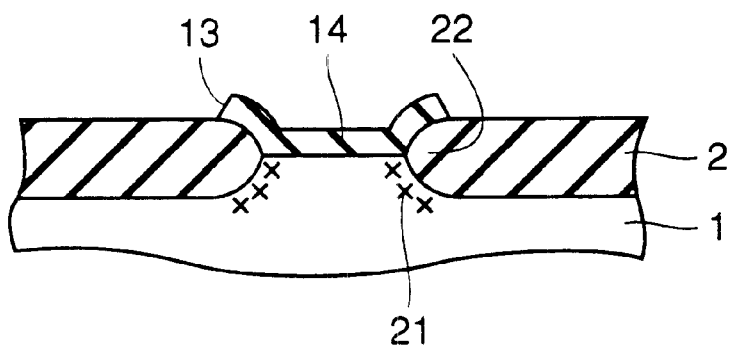
Figure 58A:
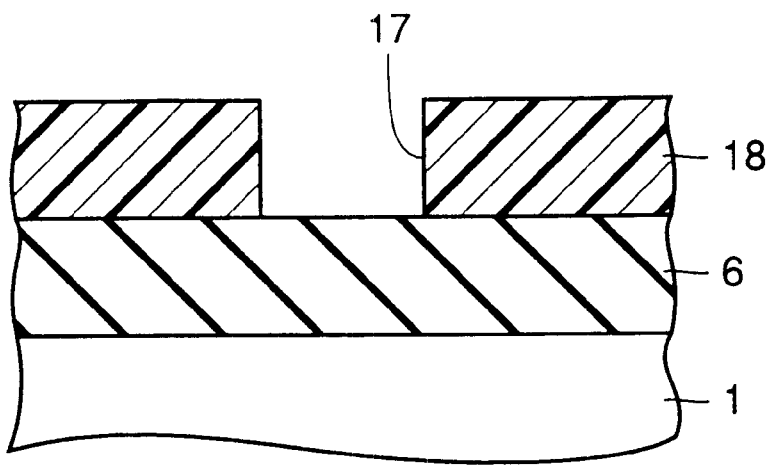
FIGS. 58A and 58B are diagrams showing a method of forming a conventional contact hole.
Figure 58B:
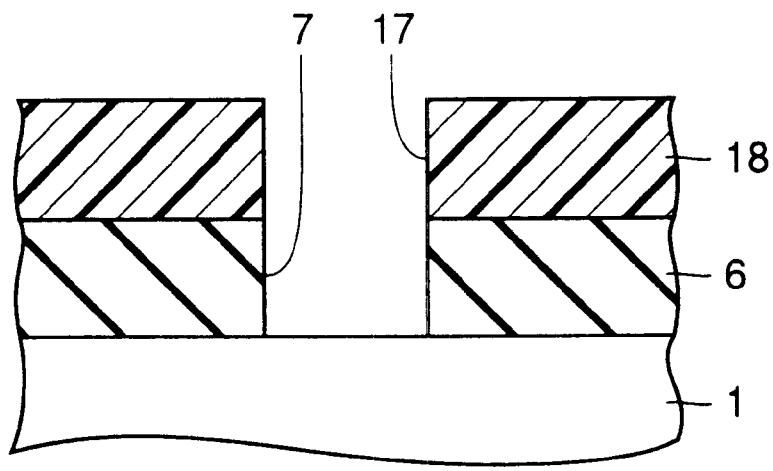

FIG. 2 is a sectional view of a semiconductor device according to Embodiment 2. Since Embodiment 2 is similar to Embodiment 1 excluding the following point, the same or corresponding portions are labelled with the same reference characters, and the description thereof will not be repeated. Field oxide film 2 is generally divided into a body region 16 having an approximately constant thickness and a region 15 seen in FIG. 2 as having a profile generally like that of a bird's beak and having a thickness which gradually decreases in the direction toward active region 3. In this embodiment, perpendicular surface 2e at the end portion of the field oxide film is physically located further into body region 16 of the field oxide film 2 than was the case in Embodiment 1 described above. Such a structure is obtained by etching interlayer insulating film 6 to a location corresponding to the position of an end portion 13 of mask 14 when contact hole 7 is formed. This is best understood with reference to FIGS. 2, 57B and 58. By etching field oxide film 2 up to the position of the end portion of mask 14, many of the defects which exist directly under the end portion of the field oxide film are simultaneously removed. Therefore, since the number of defects increasing leakage current is reduced, leakage current is decreased, resulting in a dynamic random access memory having an increased hold time of information.

The above-described perpendicular surface 2e does not have to be a completely perpendicular surface. Surface 2e includes a slightly inclined surface, that is, an approximately perpendicular surface. This is because a slight inclination may be generated depending on an etching method used.

Embodiment 3

Figure 3:
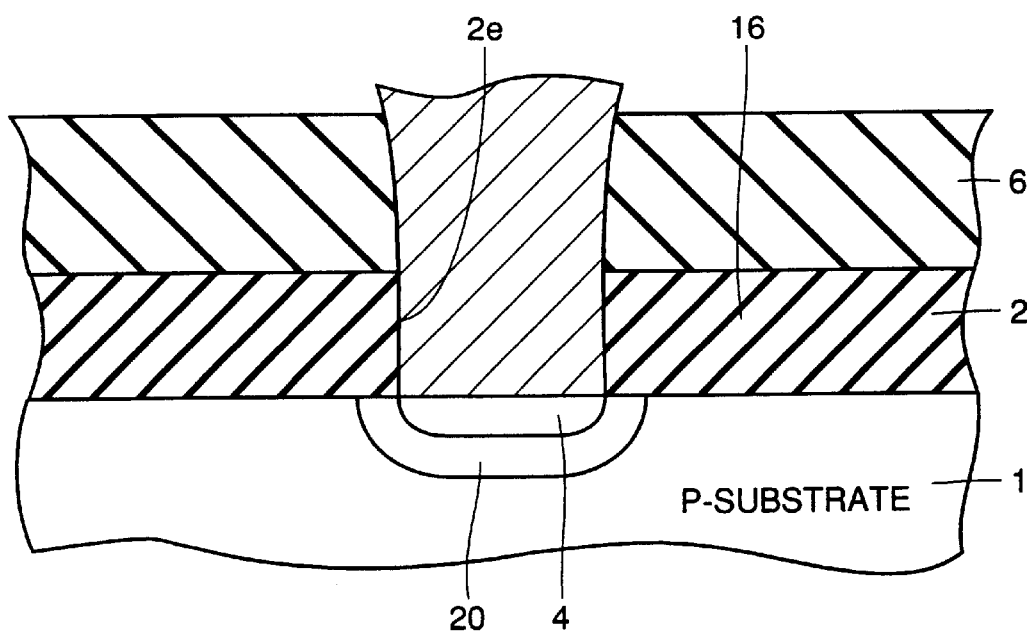
FIG. 3 is a sectional view of a semiconductor device according to Embodiment 3.

FIG. 3 is a sectional view of a semiconductor device according to Embodiment 3.

Since Embodiment 3 is similar to Embodiment 2 excluding the following point, the same or corresponding portions are labelled with the same reference characters, and the description thereof will not be repeated.

As was to the case with Embodiment 2, for Embodiment 3 the perpendicular surface 2e at the end portion of field oxide film 2 is located further back into body region 16 of field oxide film 2 them in Embodiment 1.

Such a structure was obtained by enlarging the diameter of the contact hole in Embodiment 2. However, referring to FIGS. 57A, 57B, 57C, 58A and 58B, such a structure is obtained by making the region of mask 14 smaller than the region of contact hole 7 in Embodiment 3. Almost all of the defects are removed simultaneously with etching of the oxide film also in Embodiment 3. Therefore, since the number of defects increasing leakage current is reduced, a hold time of information can be increased.

Embodiment 4

Figure 4:
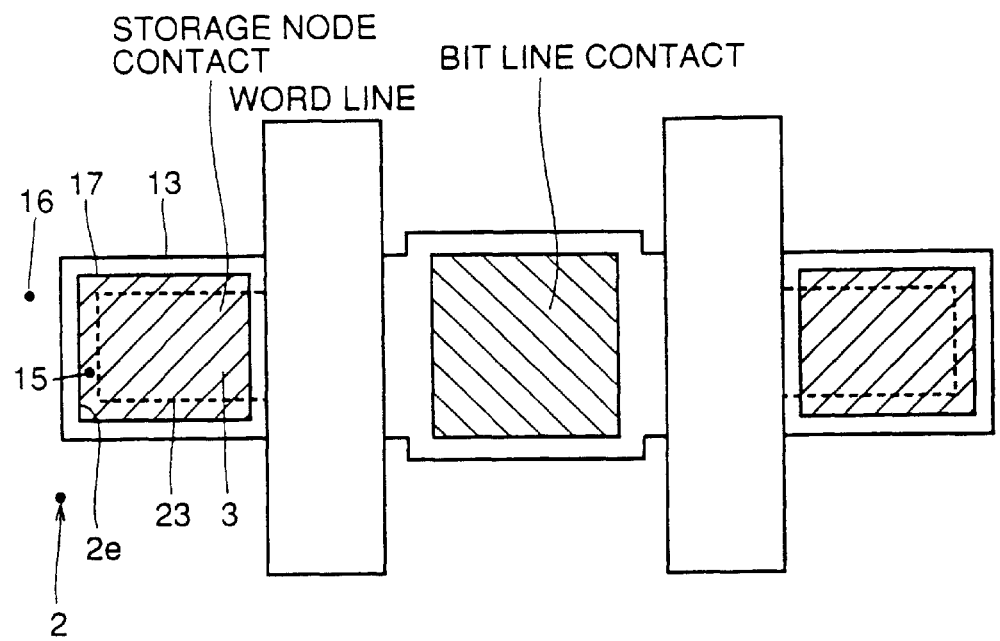
FIG. 4 is a layout diagram of a semiconductor device according to Embodiment 4.

FIG. 4 is a layout diagram of a semiconductor device according to Embodiment 4. In the figure, a contour 13 represents an end portion 13 of mask 14 of FIG. 57A. A contour 17 represents an opening portion 17 of a resist 18 referring to FIG. 58A. A contour 23 represents a contour of active region 3 with reference to FIGS. 4 and 57C.

Figure 57C:
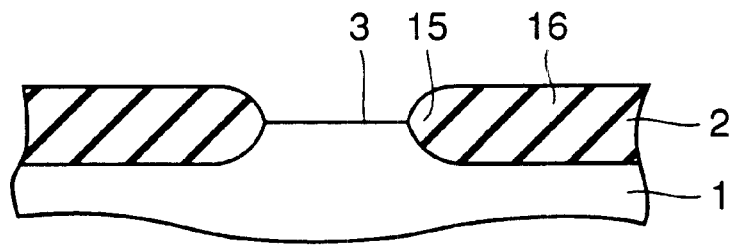

Referring to FIGS. 4 and 57C, field oxide film 2 is divided into body region 16 having an approximately constant thickness and bird's beak region 15 having a thickness gradually decreased in the direction toward active region 3. In Embodiment 4, the perpendicular surface 2e at the end portion of field oxide film 2 is located within what was the so-called bird's beak region 15 which is best seen in FIG. 57C. Perpendicular surface 2e at the end portion of field oxide film 2 is continuously formed along the perimeter of active region 3. Such a structure is obtained by etching the end portion of field oxide film 2 along the perimeter of active region 3 in the direction perpendicular with respect to the surface of the semiconductor substrate. By this etching, the number of defects increasing leakage current is reduced, resulting in an increased hold time of information.

Embodiment 5

Figure 5:
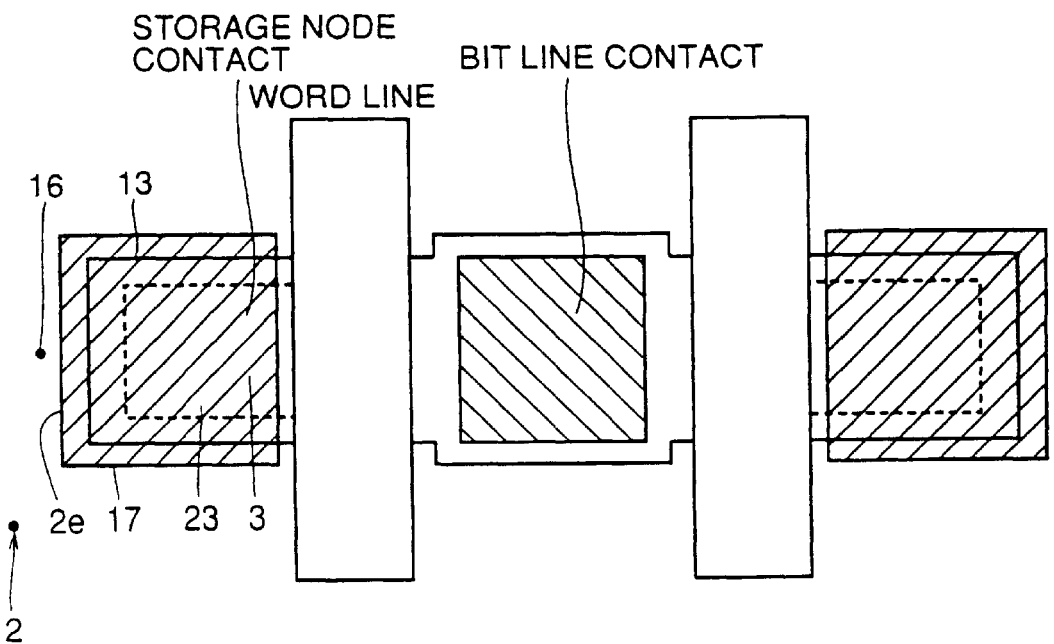
FIG. 5 is a layout diagram of a semiconductor device according to Embodiment 5.

FIG. 5 is a layout diagram of a semiconductor device according to Embodiment 5. Since the semiconductor device according to Embodiment 5 is similar to the semiconductor device according to Embodiment 4 excluding the following point, the same or corresponding portions are labelled with the same reference characters, and the description thereof will not be repeated.

In Embodiment 5, perpendicular surface 2e at the end portion of field oxide film 2 is located well into the body region 16 of field oxide film 2. See FIG. 5 Also in this embodiment, perpendicular surface 2e at the end portion of field oxide film 2 is continuously formed along the perimeter of active region 3. Almost all of the defects are simultaneously removed with etching-away of the end portion of field oxide film 2. Therefore, since the number of defects increasing leakage current is reduced, a hold time of information can be increased.

Embodiment 6

Figure 6:
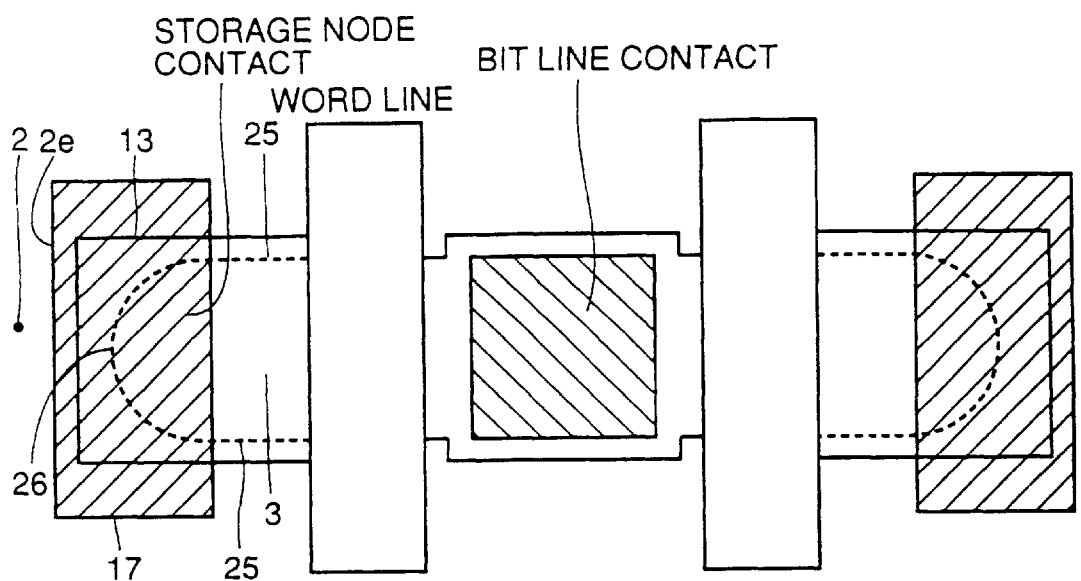
FIG. 6 is a layout diagram of a semiconductor device according to Embodiment 6.

FIG. 6 is a layout diagram of the semiconductor device according to Embodiment 6. Since the semiconductor device according to Embodiment 6 is similar to the semiconductor device according to Embodiment 5 excluding the following point, the same or corresponding portions are labelled with the same reference characters, and the description thereof will not be repeated.

As shown in the figure, active region 3 is surrounded by a pair of longer sides 25, 25 and a circular arc 26 linking end portions of the pair of longer sides 25, 25 in its planar shape. In this embodiment, opening portion 17 of resist mask 18 is formed so as to include circular arc 26 therein, with reference to FIGS. 6 and 58. When the end portion of the field oxide film is etched with such resist mask 18, perpendicular surface 2e at the end portion of field oxide film 2 is formed so as to surround circular arc 26. Simultaneously with etching of the end portion of field oxide film 2, many of the defects which exist directly under the end portion are also removed. Therefore, since the number of defects increasing leakage current is reduced, a hold time of information can be increased.

Embodiment 7

Figure 7:
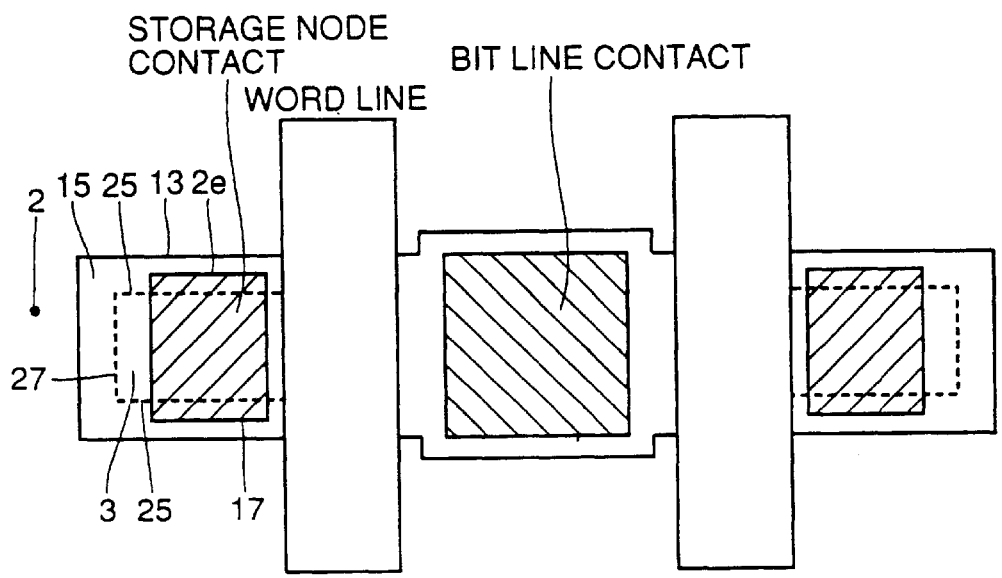
FIG. 7 is a layout diagram of a semiconductor device according to Embodiment 7.

FIG. 7 is a layout diagram of the semiconductor device according to Embodiment 7. Since the semiconductor device according to Embodiment 7 is similar to the semiconductor device according to Embodiment 4 excluding the following point, the same or corresponding portions are labelled with the same reference characters, and the description thereof will not be repeated.

Referring to FIG. 7, active region 3 is surrounded by a pair of longer sides 25, 25 and a shorter side 27 linking end portions of the pair of longer sides 25, 25 in its planar shape. Perpendicular surface 2e at the end portion of field oxide film 2 is formed only on the side of longer side 25 of active region 3, and is provided at the end portion of field oxide film 2 thereat and also is formed so as to be located within the so-called bird's beak region 15. Simultaneously with etching of the end portion of field oxide film 2 for formation of perpendicular surface 2e at the end portion of field oxide film 2, almost all of the defects which exist directly under the end portion of field oxide film 2 are removed. Therefore, since the number of defects increasing leakage current is reduced, a hold time of information can be increased.

Embodiment 8

Figure 8:
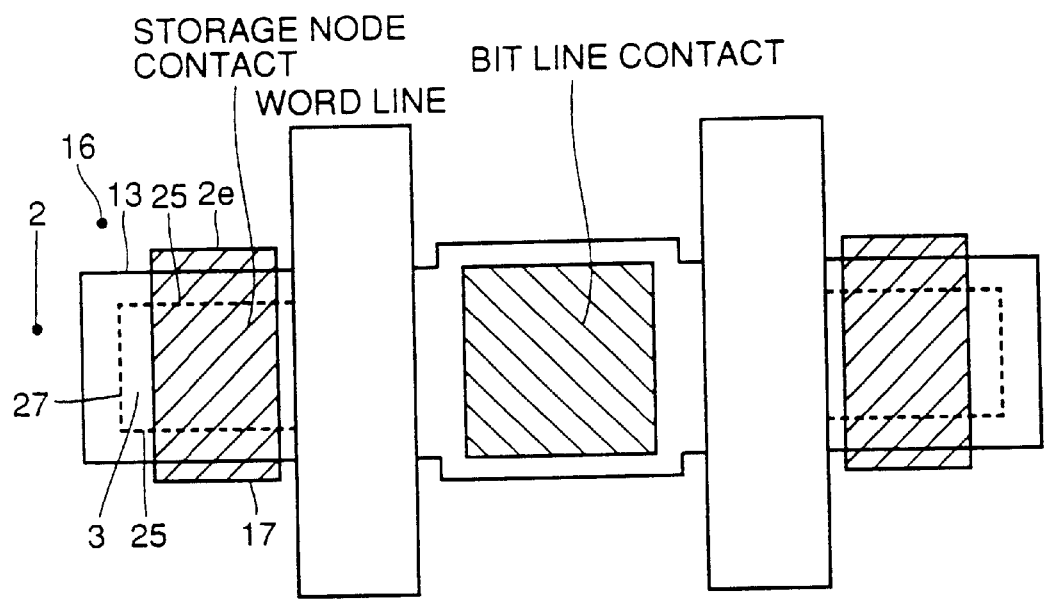
FIG. 8 is a layout diagram of a semiconductor device according to Embodiment 8.

FIG. 8 is a layout diagram of the semiconductor device according to Embodiment 8. Since the semiconductor device according to Embodiment 8 is similar to the semiconductor device according to Embodiment 7 excluding the following point, the same or corresponding portions are labelled with the same reference characters, and the description thereof will not be repeated.

Perpendicular surface 2e at the end portion of field oxide film 2 is formed only on the side of longer sides 25, 25 of active region 3. Perpendicular surface 2e at the end portion of field oxide film 2 is located within the body region 16 of field oxide film 2. Simultaneously with etching of the end portion of the field oxide film for formation of perpendicular surface 2e at the end portion of field oxide film 2, many of the defects which exist directly under the end portion of the field oxide film are removed. Therefore, since the number defects increasing leakage current is reduced, a hold time of information can be increased.

Embodiment 9

Figure 9:
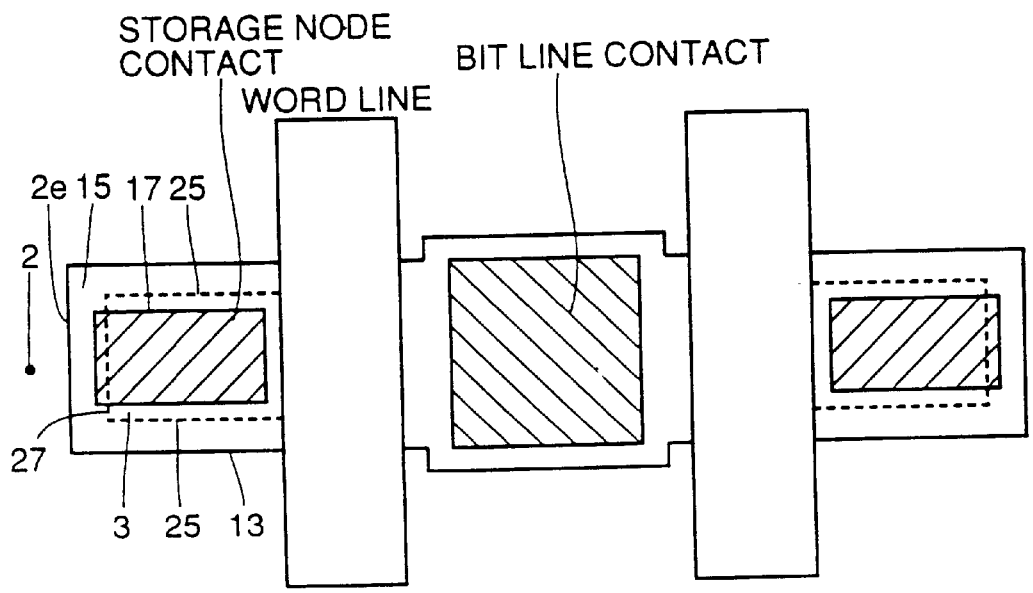
FIG. 9 is a layout diagram of a semiconductor device according to Embodiment 9.

FIG. 9 is a layout diagram of the semiconductor device according to Embodiment 9. Since the semiconductor device according to Embodiment 9 is similar to the semiconductor device according to Embodiment 7 excluding the following point, the same or corresponding portions are labelled with the same reference characters, and the description thereof will not be repeated.

Active region 3 is surrounded by a pair of longer sides 25, 25 and shorter side 27 linking end portions of the pair of longer sides 25, 25 in its planar shape. Perpendicular surface 2e at the end portion of field oxide film 2 is formed only on the side of shorter side 27 of active region 3. Perpendicular surface 2e at the end portion of field oxide film 2 is formed so as to be located within the so-called bird's beak region 15 of the field oxide film. Simultaneously with etching of the end portion of the field oxide film for formation of perpendicular surface 2e at the end portion of field oxide film 2, many of the defects which exist directly under the end portion of the field oxide film are removed. Therefore, since the number of defects increasing leakage current is decreased, a hold time of information can be increased.

Embodiment 10

Figure 10:
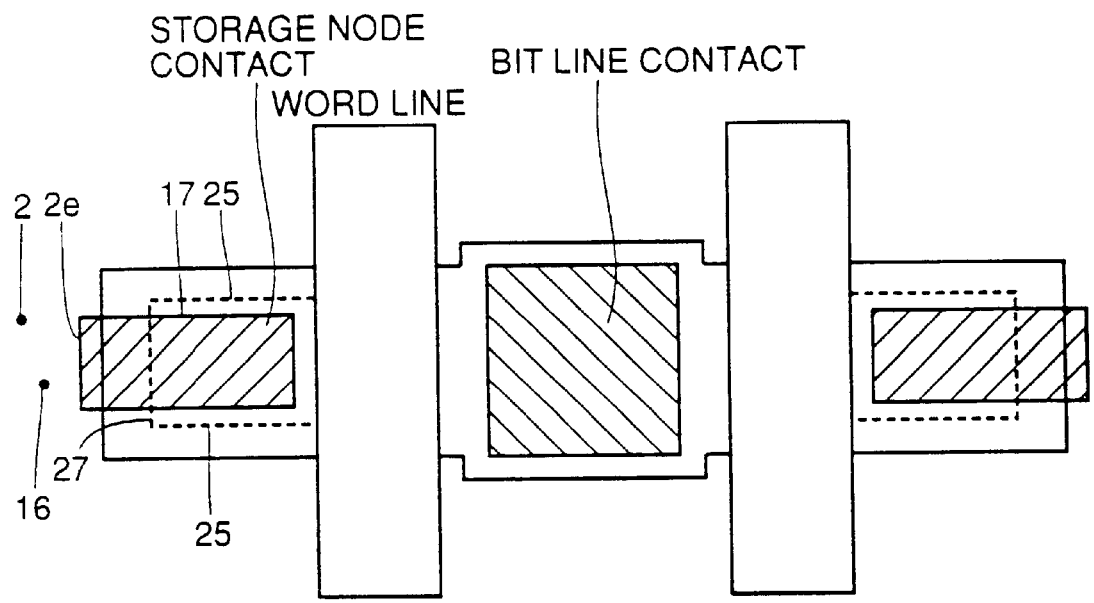
FIG. 10 is a layout diagram of a semiconductor device according to Embodiment 10.

FIG. 10 is a layout diagram of the semiconductor device according to Embodiment 10. Since the semiconductor device according to Embodiment 10 is similar to the semiconductor device according to Embodiment 9 excluding the following point, the same or corresponding portions are labelled with the same reference characters, and the description thereof will not be repeated.

In Embodiment 10, perpendicular surface 2e at the end portion of field oxide film 2 is formed only on the side of shorter side 27 of active region 3. Perpendicular surface 2e at the end portion of field oxide film 2 is formed so as to body region 16 of field oxide film 2. Many of the defects which exist directly under the end portion of field oxide film 2 are removed simultaneously with formation of perpendicular surface 2e at the end portion of field oxide film 2.

Embodiment 11

Figure 11:
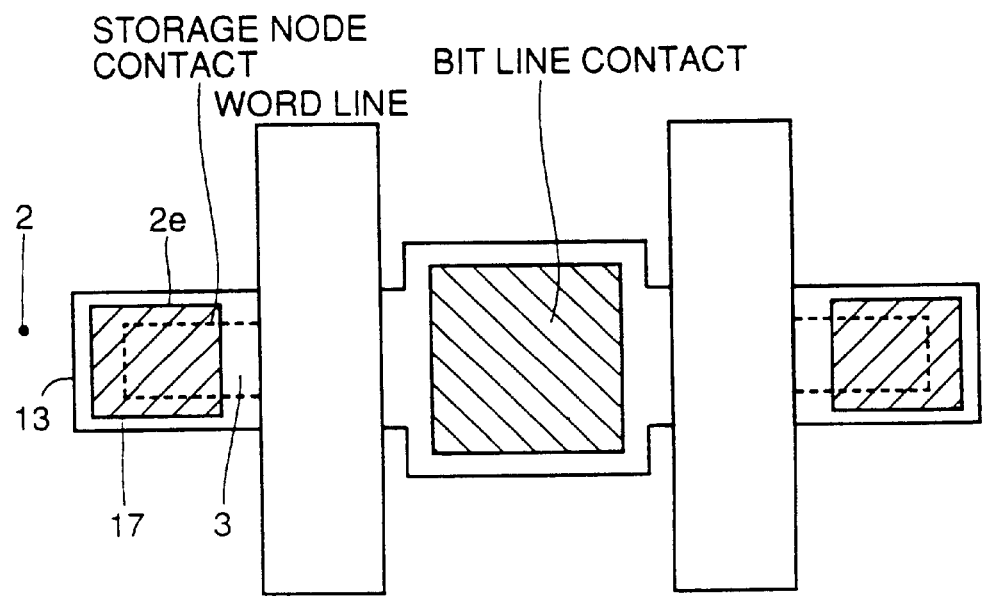
FIG. 11 is a layout diagram of a semiconductor device according to Embodiment 11.

FIG. 11 is a layout diagram of the semiconductor device according to Embodiment 11. Since the semiconductor device according to Embodiment 11 is similar to the semiconductor device according to Embodiment 4 excluding the following point, the same or corresponding portions are labelled with the same reference characters, and the description thereof will not be repeated.

In this embodiment, mask 14 for forming active region 3 is made smaller than that of Embodiment 4 with reference to FIGS. 11 and 57. More specifically, contour 13 is smaller than the case of Embodiment 4. In such an embodiment like this, the similar effects as those of the semiconductor device according to Embodiment 4 can be expected.

Embodiment 12

Figure 12:
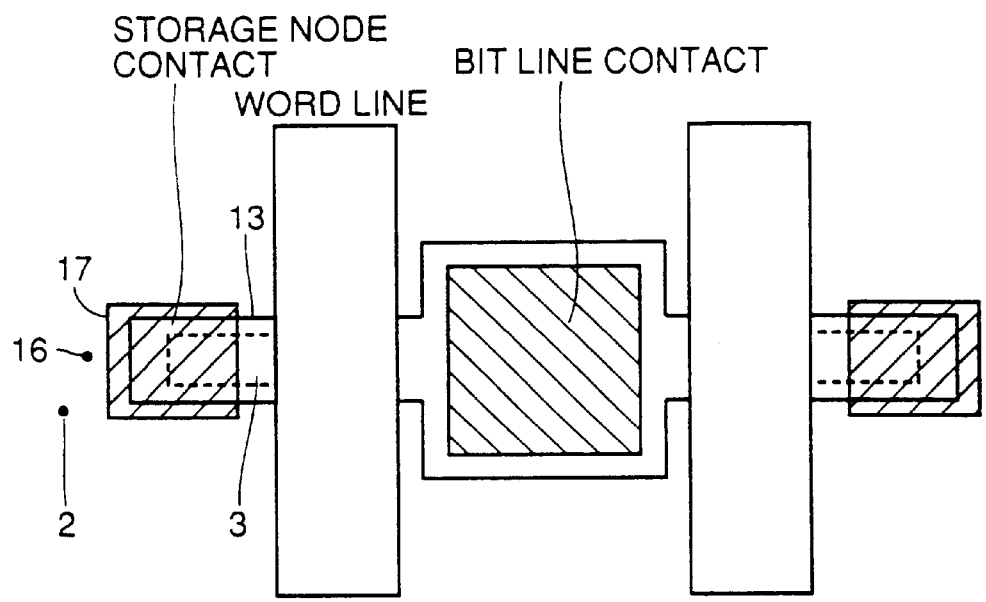
FIG. 12 is a layout diagram of a semiconductor device according to Embodiment 12.

FIG. 12 is a layout diagram of the semiconductor device according to Embodiment 12. Since the semiconductor device according to Embodiment 12 is similar to the semiconductor device according to Embodiment 5 excluding the following point, the same or corresponding portions are labelled with the same reference characters, and the description thereof will not be repeated.

In the semiconductor device according to Embodiment 12, the size of active region 3 is made smaller than that of the semiconductor device according to Embodiment 5. In such a structure like this, the similar effects as those of Embodiment 5 can be expected.

Embodiment 13

Figure 13:
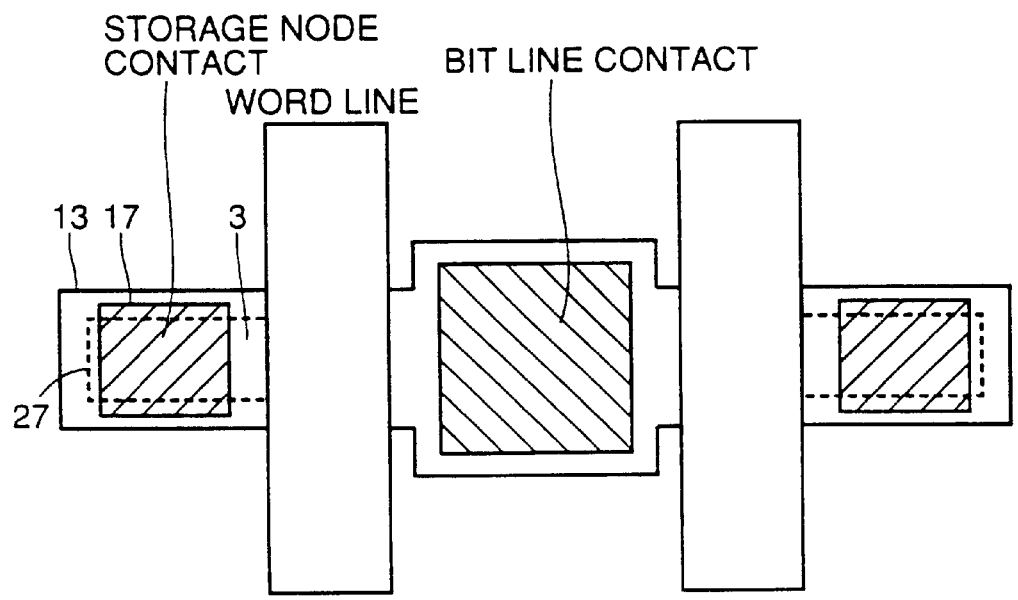
FIG. 13 is a layout diagram of a semiconductor device according to Embodiment 13.

FIG. 13 is a layout diagram of the semiconductor device according to Embodiment 13. Since the semiconductor device according to Embodiment 13 is similar to the semiconductor device according to Embodiment 7 excluding the following point, the same or corresponding portions are labelled with the same reference characters, and the description thereof will not be repeated.

The semiconductor device according to Embodiment 13 is different from the semiconductor device according to Embodiment 7 in that shorter side 27 of active region 3 is made smaller. In such an embodiment like this, the similar effects as those of the semiconductor device according to Embodiment 7 can be expected.

Embodiment 14

Figure 14:
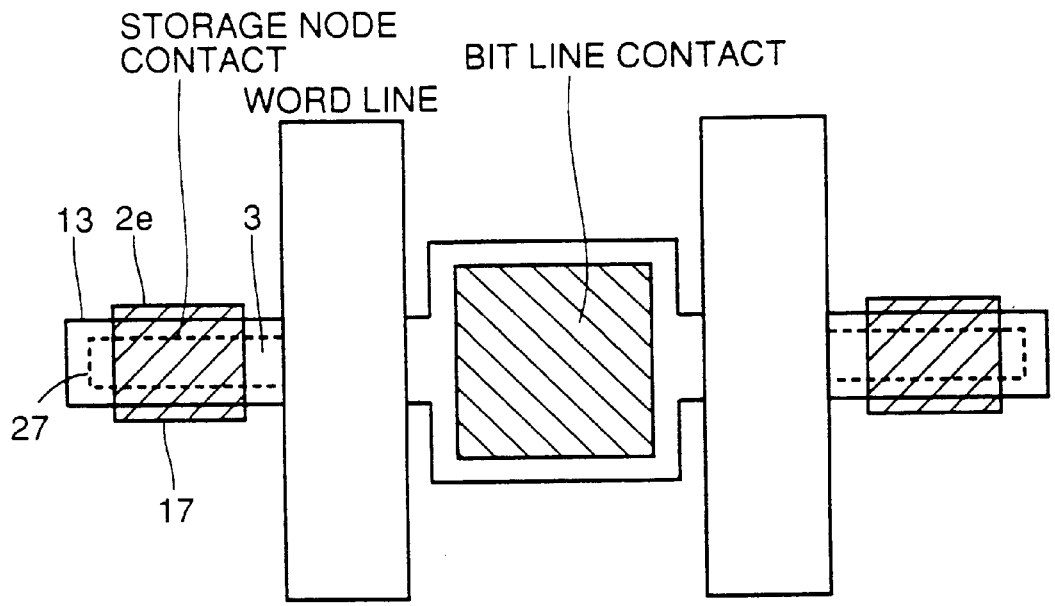
FIG. 14 is a layout diagram of a semiconductor device according to Embodiment 14.

FIG. 14 is a layout diagram of the semiconductor device according to Embodiment 14. Since the semiconductor device according to Embodiment 14 is similar to the semiconductor device according to Embodiment 8 excluding the following point, the same or corresponding portions are labelled with the same reference characters, and the description thereof will not be repeated.

In the device according to Embodiment 14, shorter side 27 of active region 3 is made smaller than that of Embodiment 8. In such an embodiment like this, the similar effects as those of the semiconductor device according to Embodiment 8 can be expected.

Embodiment 15

Figure 15:
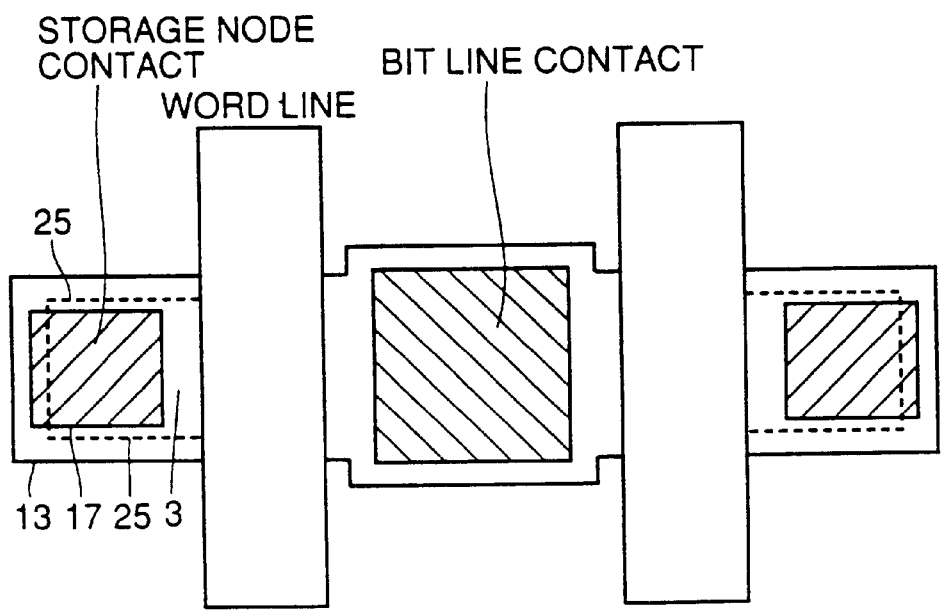
FIG. 15 is a layout diagram of a semiconductor device according to Embodiment 15.

FIG. 15 is a layout diagram of the semiconductor device according to Embodiment 15. Since the semiconductor device according to Embodiment 15 is similar to the semiconductor device according to Embodiment 9 excluding the following point, the same or corresponding portions are labelled with the same reference characters, and the description thereof will not be repeated.

The semiconductor device according to Embodiment 15 is different from the semiconductor device according to Embodiment 9 in that longer side 25 of active region 3 is made smaller. In such an embodiment like this, the similar effects as those of the semiconductor device according to Embodiment 9 can be expected.

Embodiment 16

Figure 16:
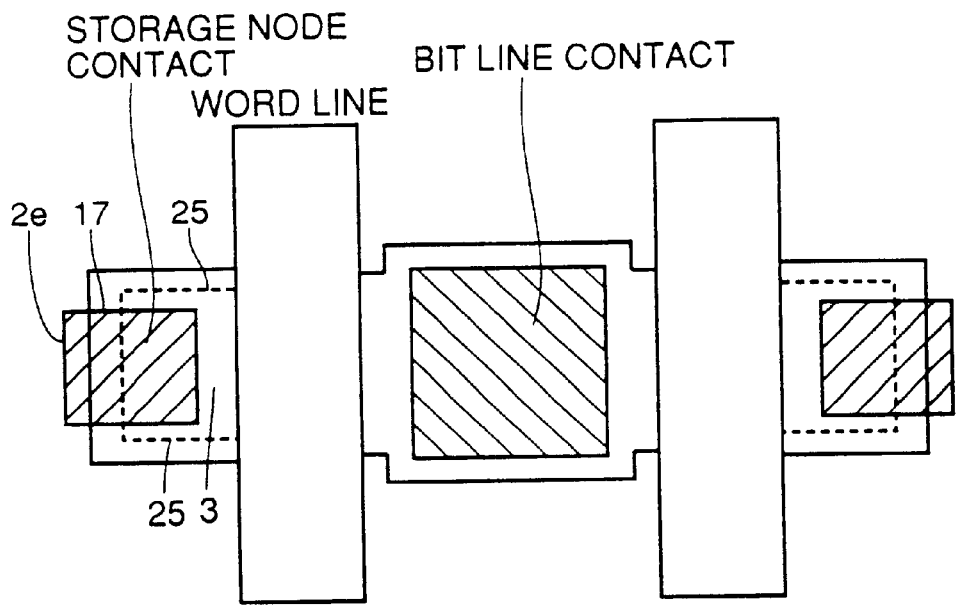
FIG. 16 is a layout diagram of a semiconductor device according to Embodiment 16.

FIG. 16 is a layout diagram of the semiconductor device according to Embodiment 16. Since the semiconductor device according to Embodiment 16 is similar to the semiconductor device according to Embodiment 10 excluding the following point, the same or corresponding portions are labelled with the same reference characters, and the description thereof will not be repeated.

In the semiconductor device according to Embodiment 16, longer side 25 of active region 3 is made smaller than that of the semiconductor device according to Embodiment 10. In such an embodiment like this, the similar effects as those of the semiconductor device according to Embodiment 10 can be expected.

Embodiment 17

Figure 17:
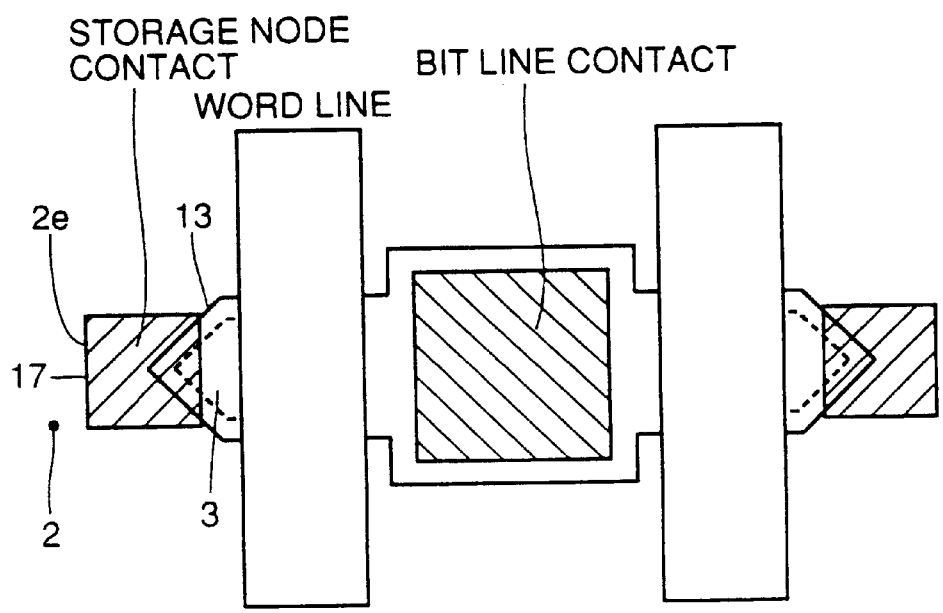
FIG. 17 is a layout diagram of a semiconductor device according to Embodiment 17.

FIG. 17 is a layout diagram of the semiconductor device according to Embodiment 17. In this embodiment, active region 3 is made extremely small. The end portion of active region 3 is a triangle. Perpendicular surface 2e at the end portion of field oxide film 2 surrounds active region 3. The end portion of field oxide film 2 is etched away for formation of perpendicular surface 2e. Simultaneously with etching of the end portion of field oxide film 2, many of the defects which exist directly under the end portion of the field oxide film are removed. Therefore, since the number of defects increasing leakage current is decreased, a hold time of information can be increased.

Embodiment 18

Figure 18:
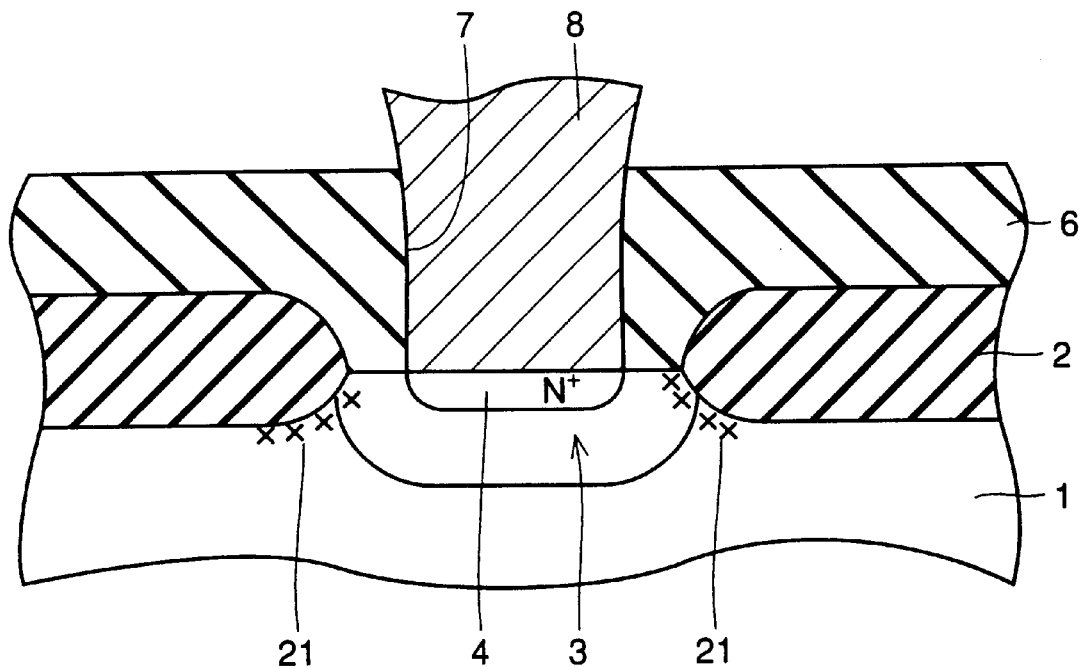
FIG. 18 is a sectional view of a semiconductor device according to Embodiment 18.

FIG. 18 is a sectional view of a semiconductor device according to Embodiment 18. The semiconductor device according to Embodiment 18 includes semiconductor substrate 1. On semiconductor substrate 1, provided is field oxide film 2 for isolating active region 3 from other active regions with its end portion surrounding active region 3. Active layer 4 is provided in the surface of active region 3. Interlayer insulating film 6 is provided on semiconductor substrate 1 so as to cover active layer 4. Contact hole 7 exposing the surface of active layer 4 is provided in interlayer insulating film 6. Storage node 8 fills contact hole 7 so as to be in contact with active layer 4. Active.layer 4 is spaced from the end portion of field oxide film 2 so as not to come in contact therewith. According to this embodiment, since active layer 4 is formed apart from defects 21, leakage current is not generated even if defects 21 exist at the end portion of field oxide film 2. As a result, a hold time of information can increased.

Embodiment 19

Figure 19:
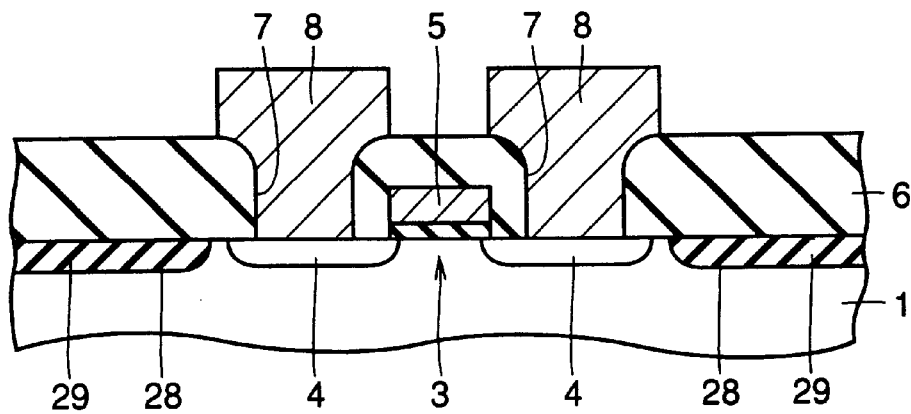
FIG. 19 is a sectional view of a semiconductor device according to Embodiment 19.

FIG. 19 is a sectional view of a semiconductor device according to Embodiment 19. The semiconductor device includes semiconductor substrate 1. A recessed portion 28 is provided in a portion other than active region 3 in the surface of semiconductor substrate 1. Recessed portion 28 is filled with an insulating film 29 formed with a chemical vapor deposition method for isolating active region 3 from other active regions. Gate electrode 5 is provided on active region 3. Active layers 4 are provided on both sides of gate electrode 5 in the surface of active region 3. Interlayer insulating film 6 is provided on semiconductor substrate 1 so as to cover gate electrode 5. Contact hole 7 exposing the surface of active layer 4 is provided in interlayer insulating film 6. Storage node 8 fills contact hole 7 so as to be connected to active layer 4. According to this embodiment, since insulating film 29 is formed with a chemical vapor deposition method, no defect is generated directly under insulating film 29. Therefore, leakage current is not generated, which in turn increases a hold time of information.

Embodiment 20

FIGS. 20 to 28 are sectional views of a semiconductor device in respective steps of the manufacturing method thereof according to Embodiment 20.

Figure 20:
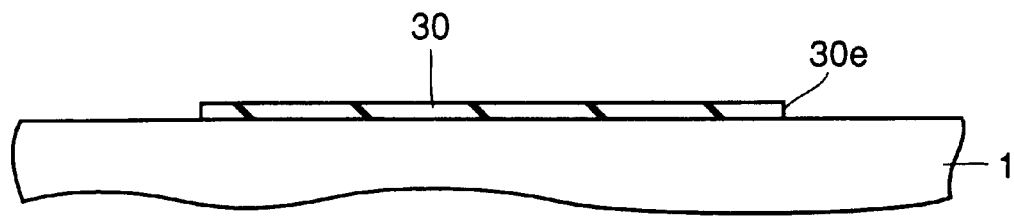
FIGS. 20 to 28 are sectional views of a semiconductor device in the first to the ninth steps of the manufacturing method of a semiconductor device according to Embodiment 20.

Referring to FIG. 20, a nitride film 30 is formed on a portion which is to serve as an active region on semiconductor substrate 1, such as a silicon substrate.

Figure 21:
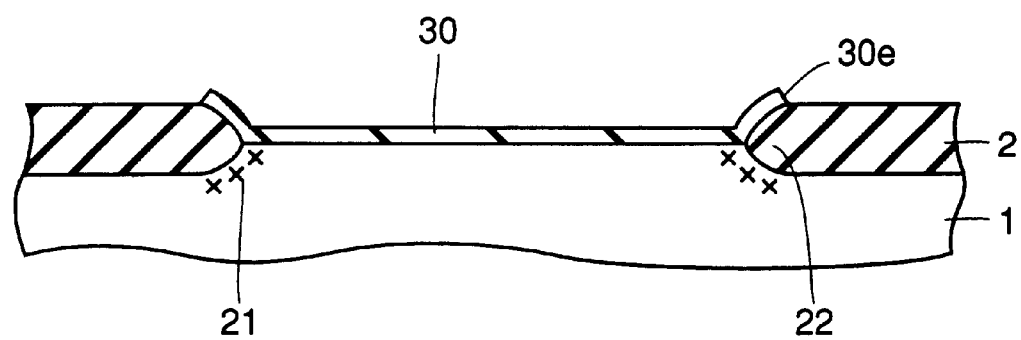
Figure 22:
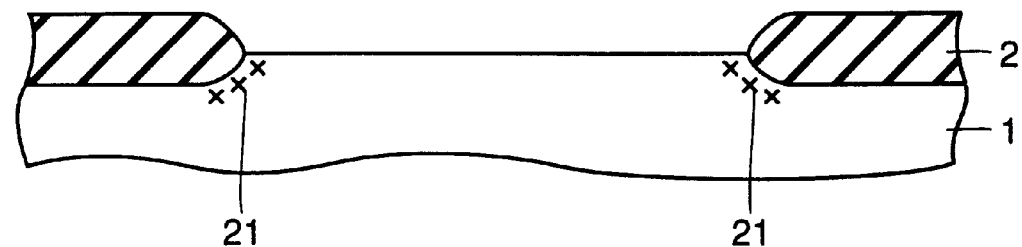

Referring to FIG. 21, field oxide film 2 is formed by thermally oxidizing the surface of silicon substrate 1 with nitride film 30 used as a mask. At this time, field oxide film 2 is formed so as to project to the side of the active region beyond an end portion 30e of nitride film 30. The projected portion is hereinafter referred to as a bird's beak portion 22. Many defects 21 are formed directly under bird's beak portion 22. Referring to FIGS. 21 and 22, nitride film 30 is removed.

Figure 23:
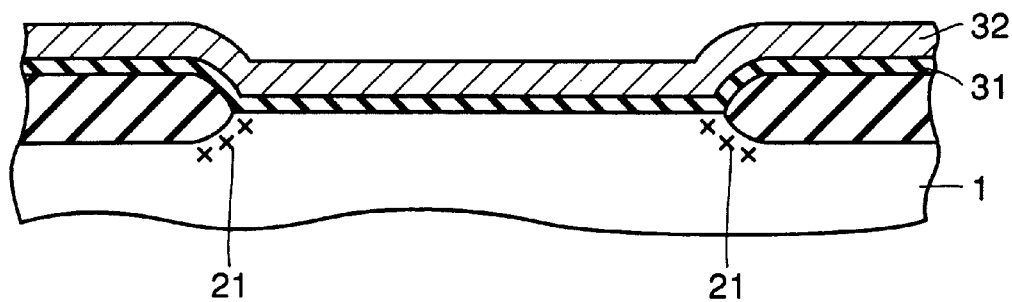
Figure 24:
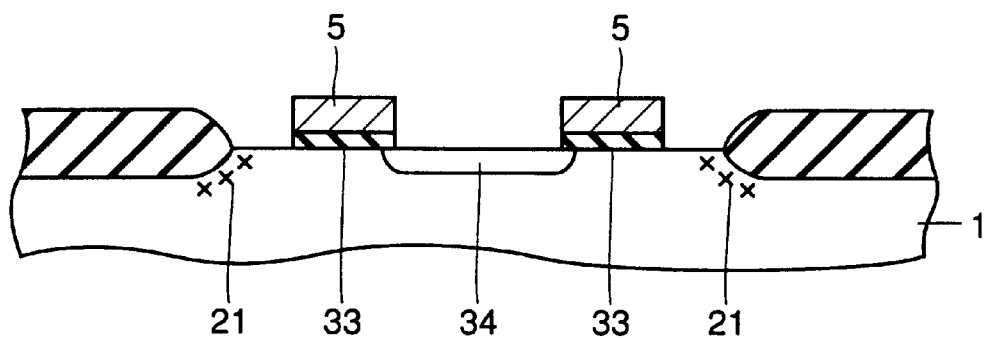

Referring to FIG. 23, an oxide film 31 which is to serve as a gate insulating film, and a conductor layer 32 which is to serve as a gate electrode are formed on silicon substrate 1. By patterning oxide film 31 and conductor layer 32, a gate insulating film 33 and gate electrode 5 are formed. An active layer 34 is formed in the surface of the active region.

Figure 25:
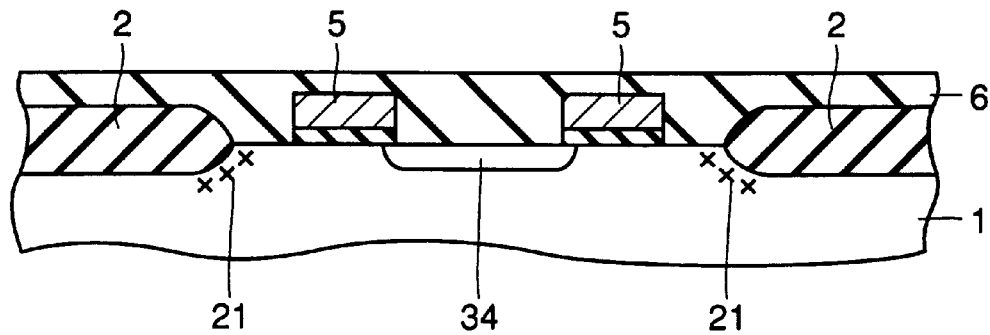

Referring to FIG. 25, interlayer insulating film 6 is deposited on silicon substrate 1 so as to cover gate electrode 5.

Figure 26:
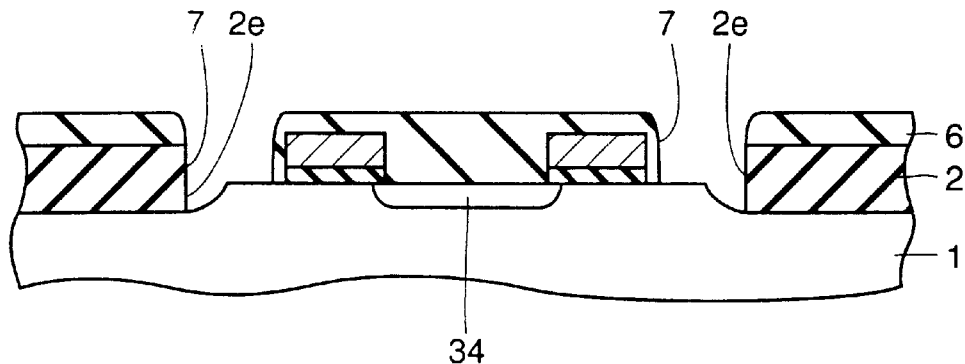
Figure 27:
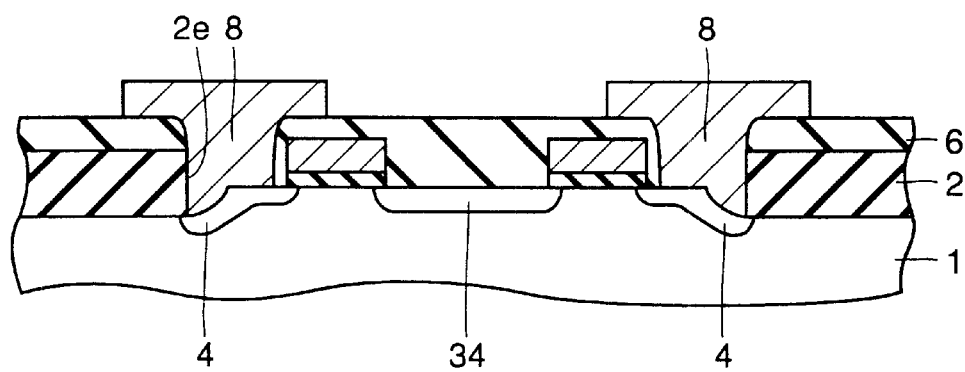
Figure 28:
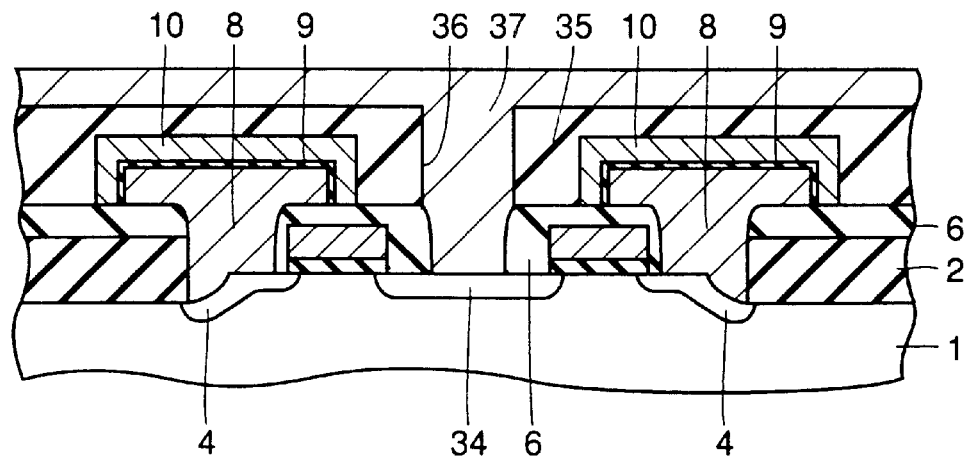

Referring to FIG. 26, contact hole 7 exposing a part of the surface of the active region is formed in interlayer insulating film 6. Simultaneously with formation of contact hole 7, the end portion of field oxide film 2 is etched away. At this time, perpendicular surface 2e at the end portion of field oxide film 2 is formed. Defects 21 which exist directly under the end portion of the field oxide film are also removed. By implanting impurity ions into the surface of the active region through contact hole 7, active layer 4 is formed. Storage node 8 fills contact hole 7 so as to be in contact with the surface of active layer 4. The surface of storage node 8 is covered with a dielectric film 9. A cell plate electrode 10 is formed on storage node 8 with dielectric film 9 interposed therebetween. An interlayer insulating film 35 is formed on silicon substrate 1 so as to cover cell plate electrode 10. A contact hole 36 exposing the surface of active layer 34 is formed in interlayer insulating films 35 and 6. Contact hole 36 is filled with a bit line 37 connected to active layer 34.

Embodiment 21

FIGS. 29 to 37 are sectional views of a semiconductor device in respective steps of the manufacturing method thereof according to Embodiment 21.

Figure 29:
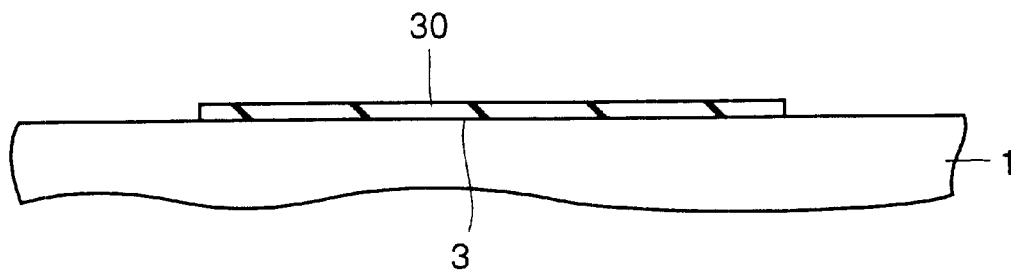
FIGS. 29 to 37 are sectional views of a semiconductor device in the first to the ninth steps of the manufacturing method of a semiconductor device according to Embodiment 21.

Referring to FIG. 29, nitride film 30 is formed on a portion which is to serve as active region 3 on silicon substrate 1.

Figure 30:
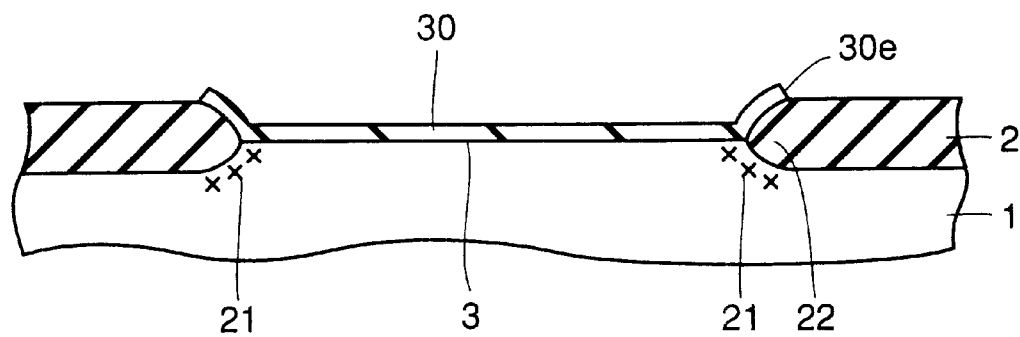

Referring to FIG. 30, by thermally oxidizing the surface of silicon substrate 1 with nitride film 30 used as a mask, field oxide film 2 is formed. At this time, field oxide film 2 is formed so as to project to the side of active region 3 beyond end portion 30e of nitride film 30. Many defects 21 are formed directly under bird's beak portion 22.

Figure 31:
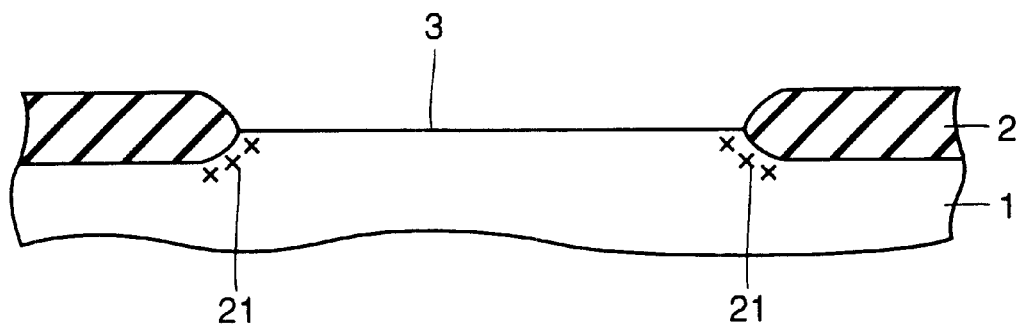

Referring to FIGS. 30 and 31, nitride film 30 is removed.

Figure 32:
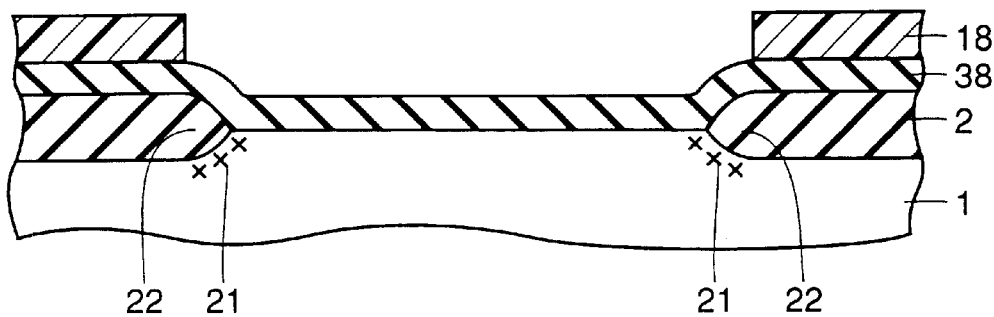

Referring to FIG. 32, an interlayer insulating film 38 for planarization is formed on silicon substrate 1. A portion excluding active region 3 and bird's beak portion 22 of field oxide film 2 is covered with resist mask 18.

Figure 33:
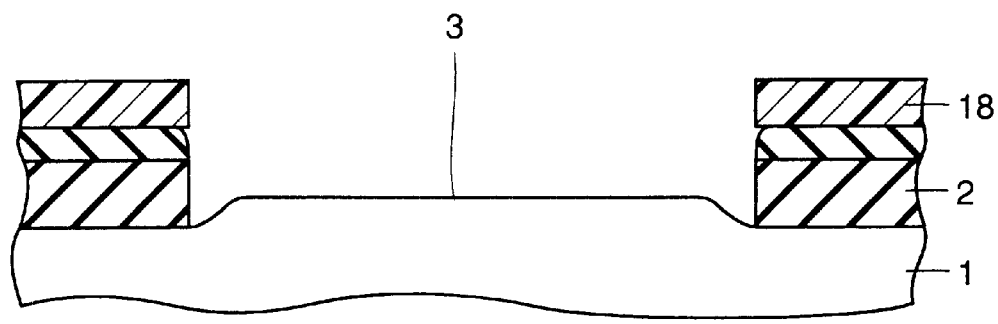

Referring to FIG. 33, interlayer insulating film 30 and bird's beak portion 22 of field oxide film 2 are etched away with resist mask 18. At this time, defects 21 generated directly under bird's beak portion 22 of field oxide film 2 are removed.

Figure 34:
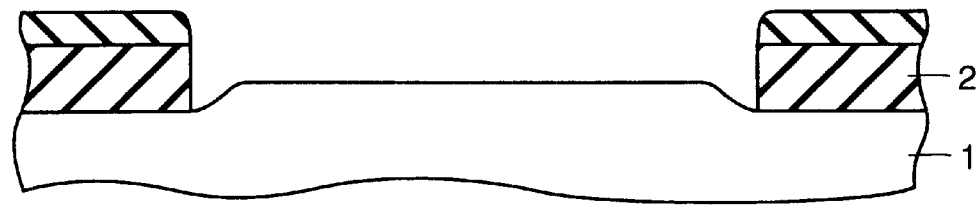

Referring to FIGS. 33 and 34, resist mask 18 is removed.

Figure 35:
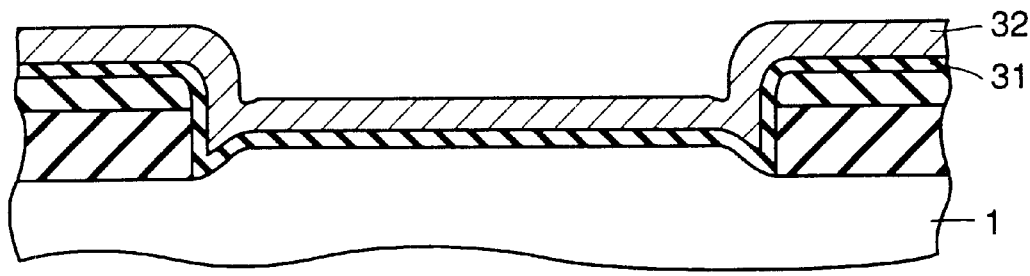
Figure 36:
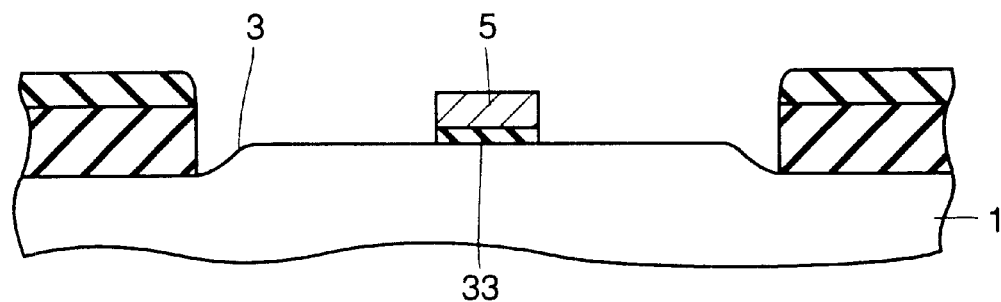
Figure 37:
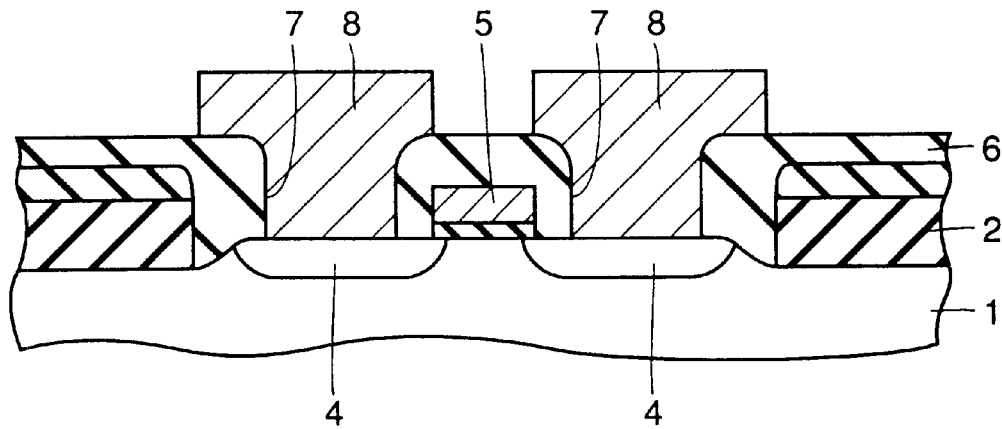

Referring to FIG. 35, oxide film 31 which is to serve as a gate insulating film and conductor layer 32 which is to serve as a gate electrode are formed on silicon substrate 1. By patterning oxide film 31 and conductor layer 32, gate insulating film 33 and gate electrode 5 are formed. By etching for patterning of oxide film 31 and conductor layer 32, defects in the surface of active region 3 are further removed.

Interlayer insulating film 6 is formed on silicon substrate 1 so as to cover gate electrode 5. Contact hole 7 is formed in interlayer insulating film 6. By implanting impurity ions into the surface of the active region through contact hole 7, active layer 4 is formed. Storage node 8 fills contact hole 7 so as to be in contact with the surface of active layer 4.

Embodiment 22

FIGS. 38 to 45 are sectional views of a semiconductor device in respective steps of the manufacturing method thereof according to Embodiment 22.

Figure 38:
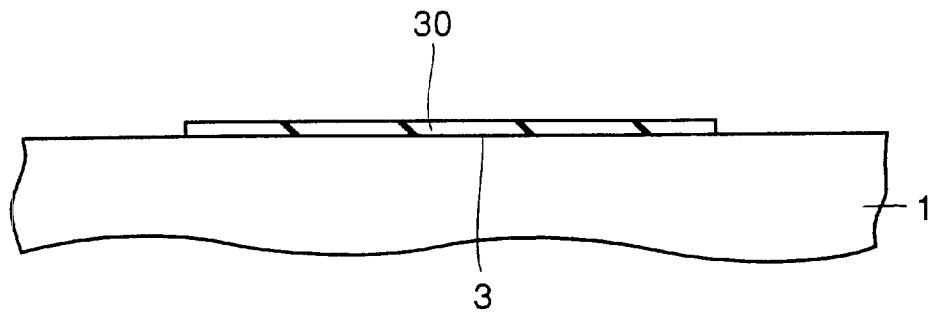
FIGS. 38 to 45 are sectional views of a semiconductor device in the first to the eighth steps of the manufacturing method of a semiconductor device according to Embodiment 22.

Referring to FIG. 38, nitride film 30 is formed on a portion which is to serve as active region 3 on silicon substrate 1.

Figure 39:
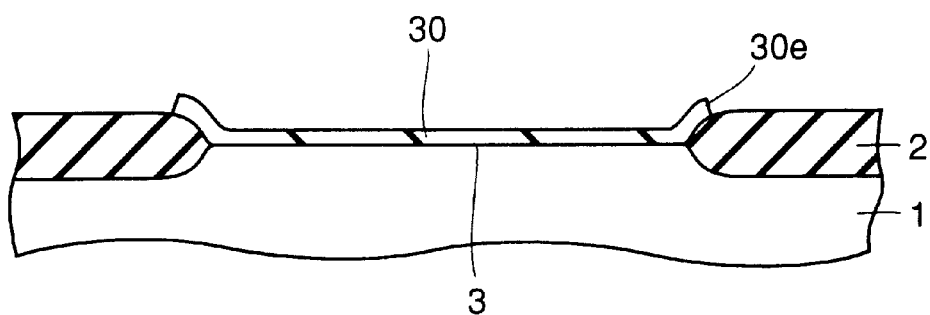

Referring to FIG. 39, by thermally oxidizing the surface of silicon substrate 1 with nitride film 30 used as a mask, field oxide film 2 is formed. At this time, field oxide film 2 is formed so as to project to the side of active region 3 beyond end portion 30e of nitride film 30.

Figure 40:
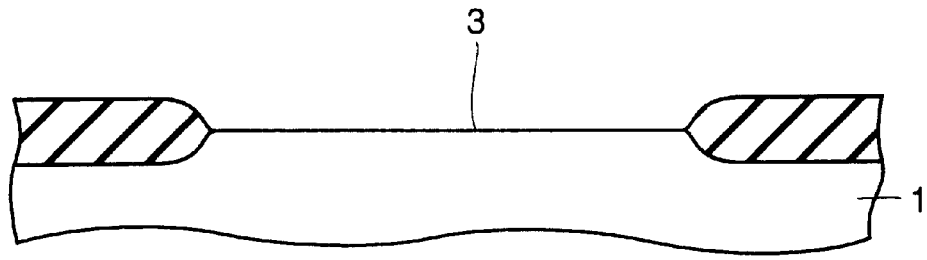

Referring to FIGS. 39 and 40, nitride film 30 is removed.

Figure 41:
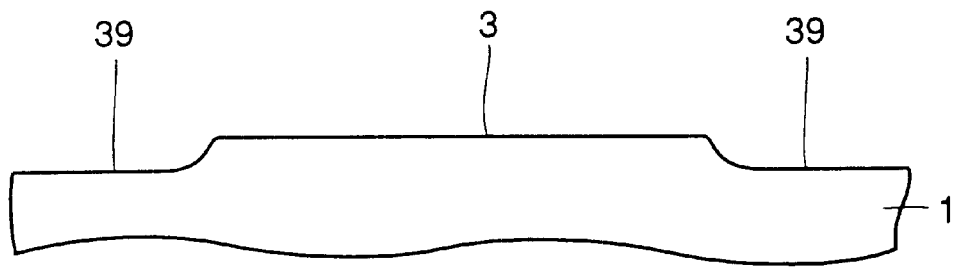

Referring to FIGS. 40 and 41, field oxide film 2 is completely removed. By removing field oxide film 2, a recessed portion 39 is formed in a portion other than active region 3 in the surface of silicon substrate 1.

Figure 42:
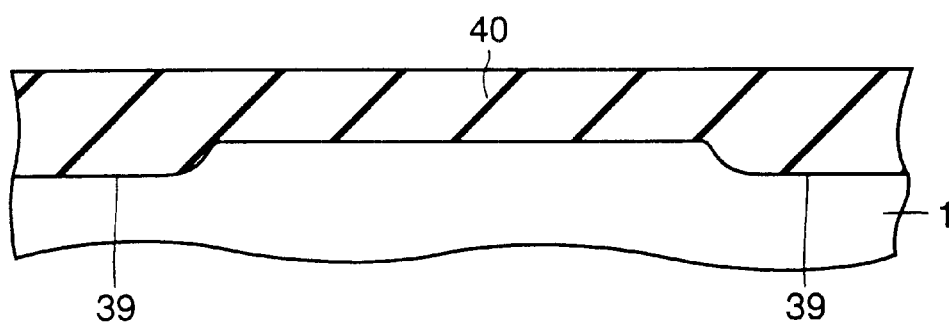
Figure 43:
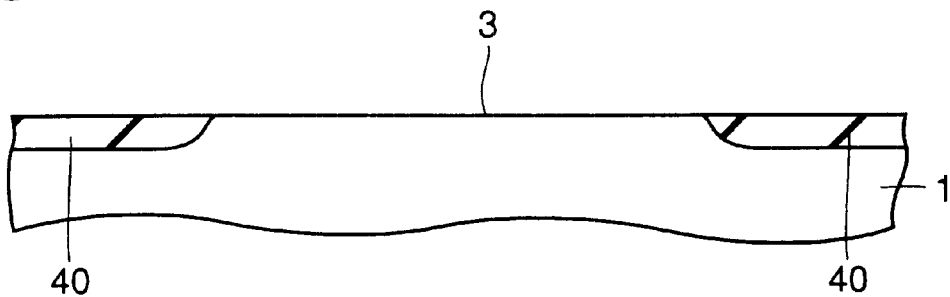

Referring to FIG. 42, an oxide film 40 with low stress is formed on silicon substrate 1 so as to fill recessed portion 39. Referring to FIGS. 42 and 43, the surface of oxide film 40 with low stress is etched to expose active region 3.

Figure 44:
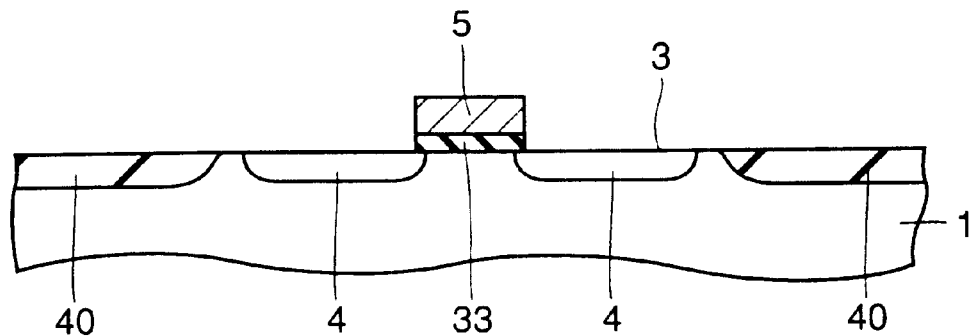

Referring to FIG. 44, gate insulating film 33 and gate electrode 5 are formed on active region 3. Active layers 4 are formed on both sides of gate electrode 5 in the surface of active region 3.

Figure 45:
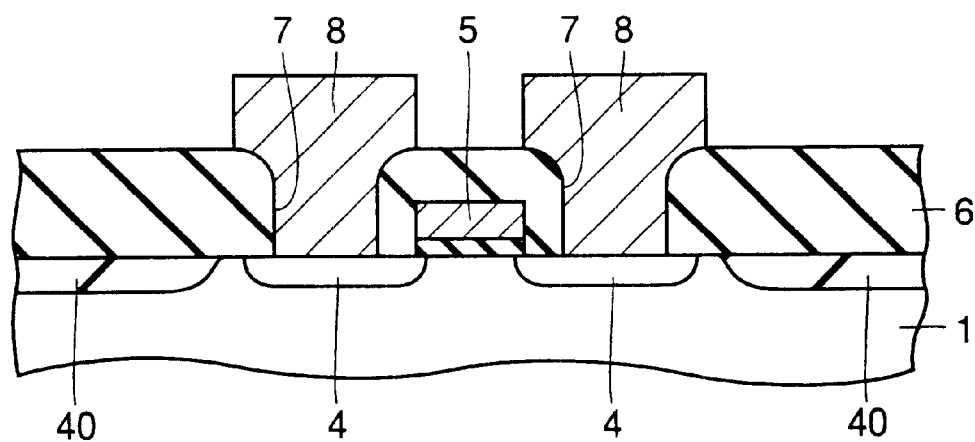

Referring to FIG. 45, interlayer insulating film 6 is formed on silicon substrate 1 so as to cover gate electrode 5. Contact hole 7 exposing the surface of active layer 4 is formed in interlayer insulating film 6. Storage node 8 fills contact hole 7 so as to be connected to active layer 4.

In this embodiment, since the insulating film for isolating active region 3 from other active regions is formed of oxide film 40 with low stress, no defect is generated directly under oxide film 40.

Embodiment 23

FIGS. 46 to 51 are sectional views of a semiconductor device in respective steps of the manufacturing method thereof according to Embodiment 23.

Figure 46:
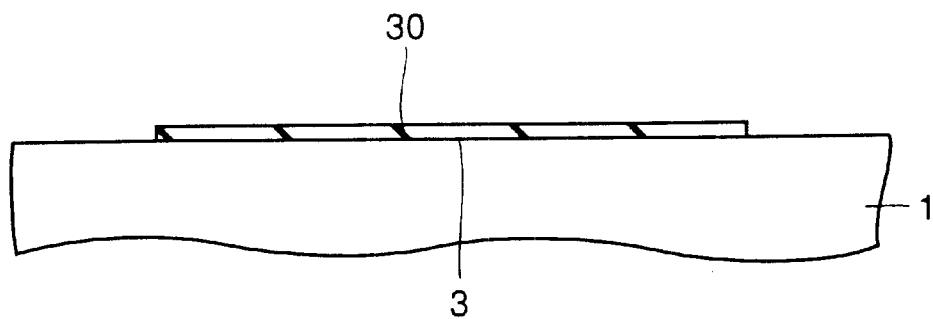
FIGS. 46 to 51 are sectional views of a semiconductor device in the first to the sixth steps of the manufacturing method of a semiconductor device according to Embodiment 23.

Referring to FIG. 46, nitride film 30 is formed on a portion which is to serve as active region 3 on silicon substrate 1.

Figure 47:
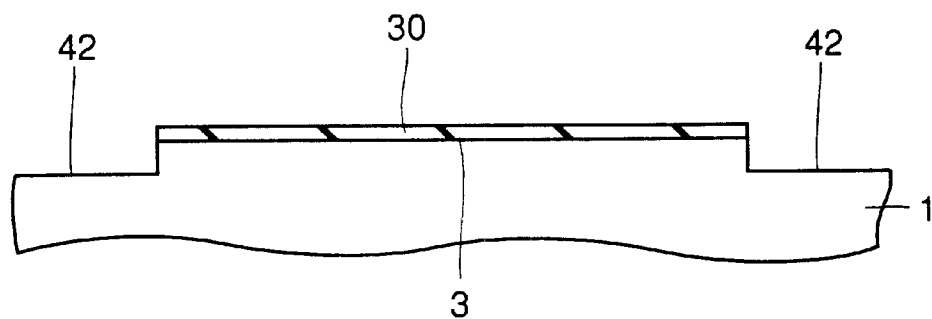

Referring to FIG. 47, a portion corresponding to an isolation region is etched with nitride film 30 used as a mask to form a recessed portion 42.

Figure 48:
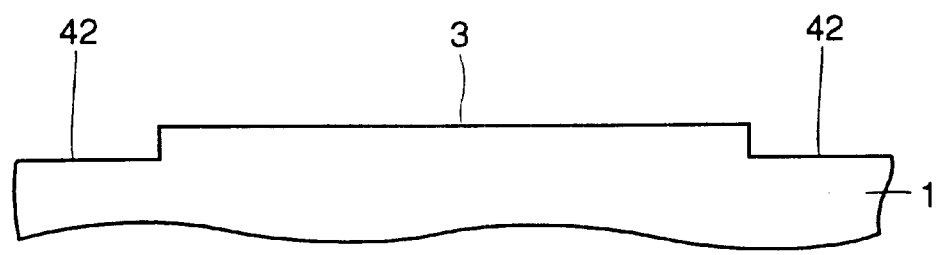

Referring to FIGS. 47 and 48, nitride film 30 is removed.

Figure 49:
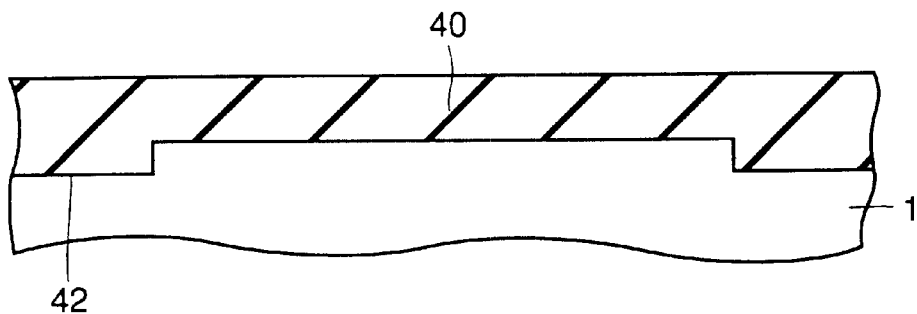

Referring to FIG. 49, oxide film 40 with low stress is deposited on silicon substrate 1 so as to fill recessed portion 42.

Figure 50:
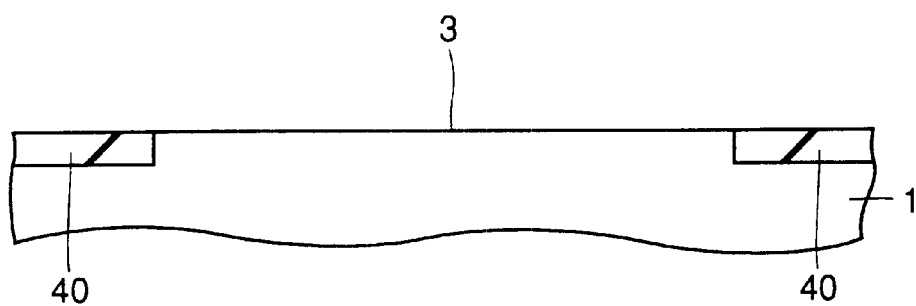

Referring to FIGS. 49 and 50, the surface of oxide film 40 is etched to expose the surface of active region 3.

Figure 51:
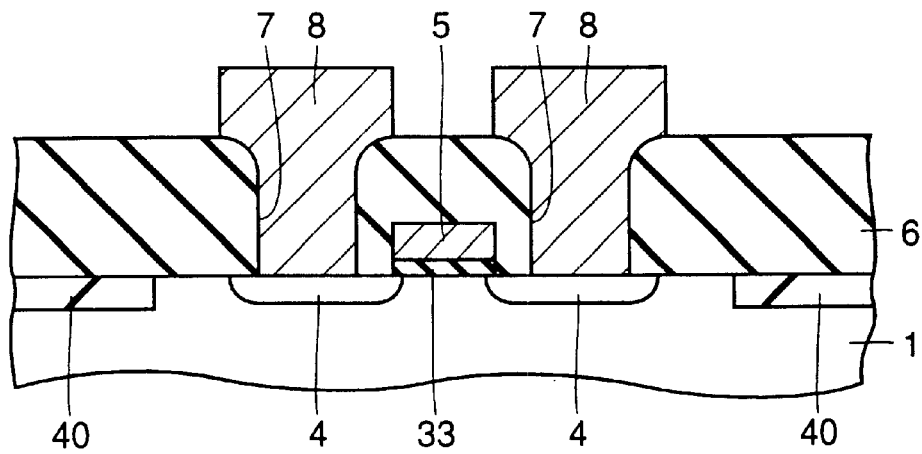
Figure 52:
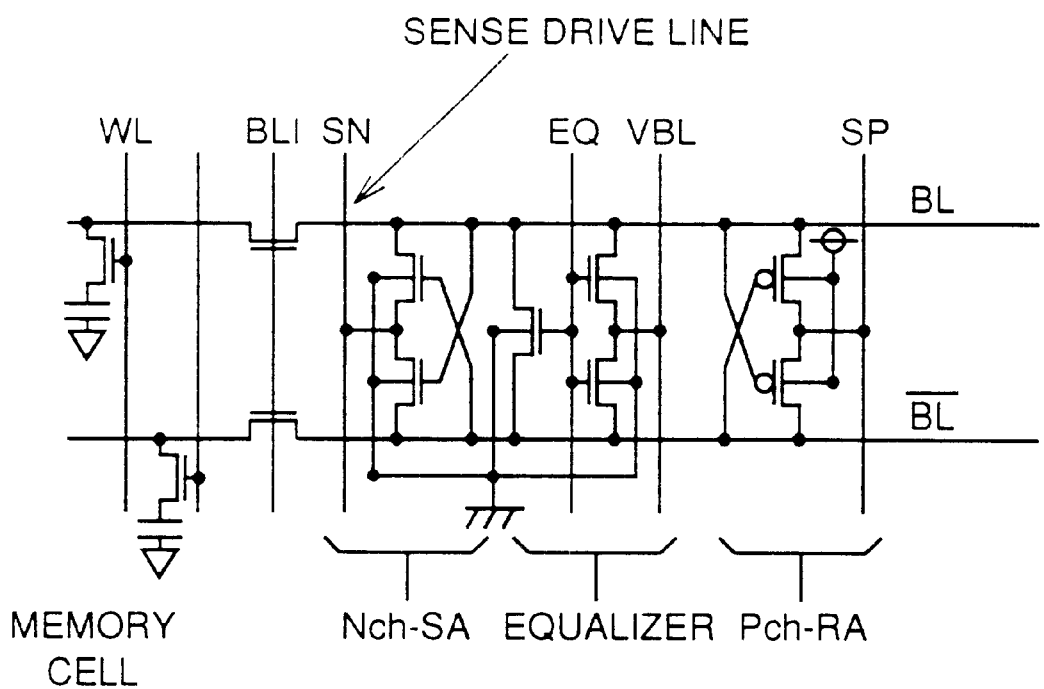
FIG. 52 is a diagram of an array.configuration of a conventional DRAM.
Figures 53A, 53B, 53C, 53D, 53E:
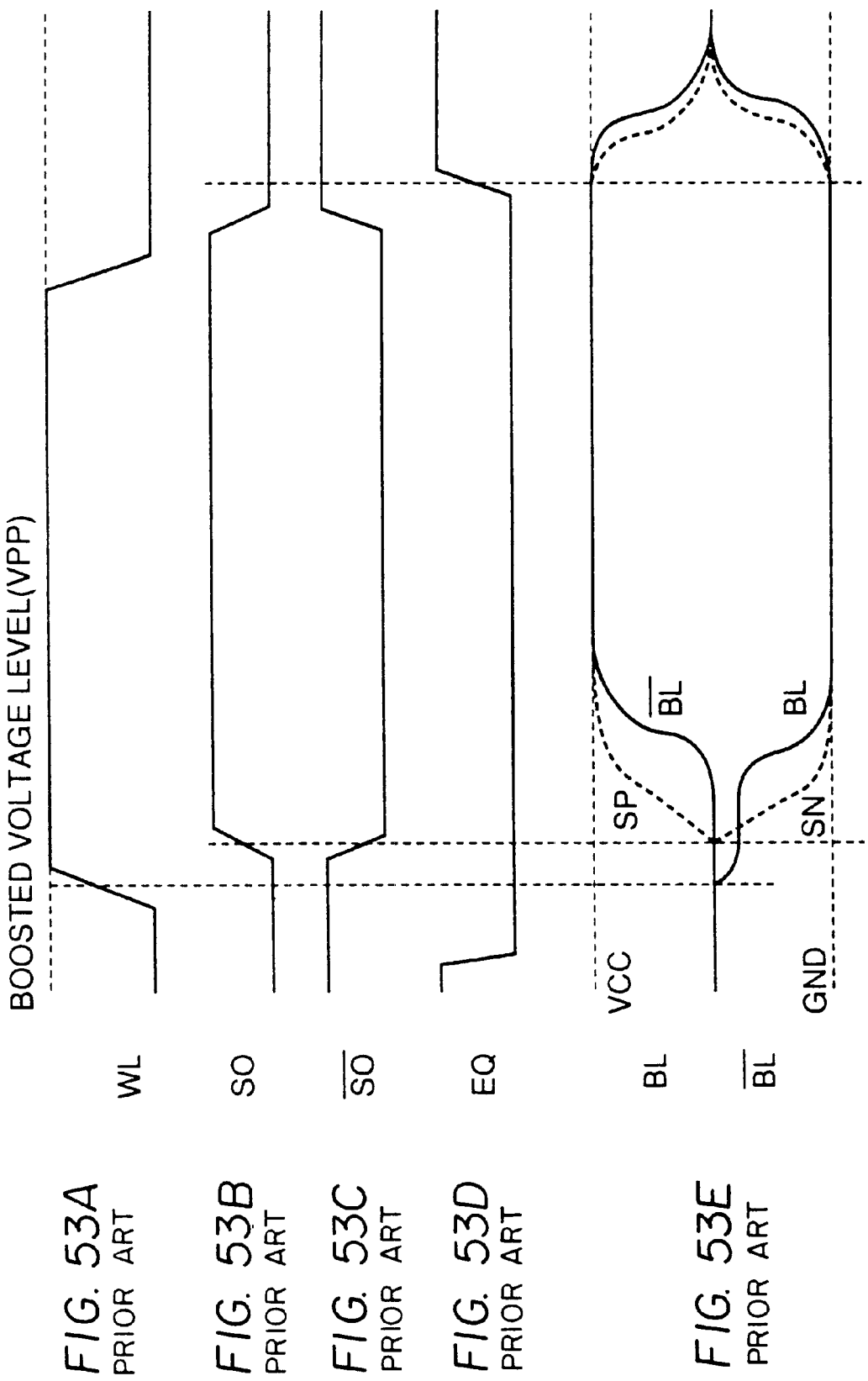
FIGS. 53A–53E are diagrams of waveforms of array operation of the conventional DRAM.
Figure 54:
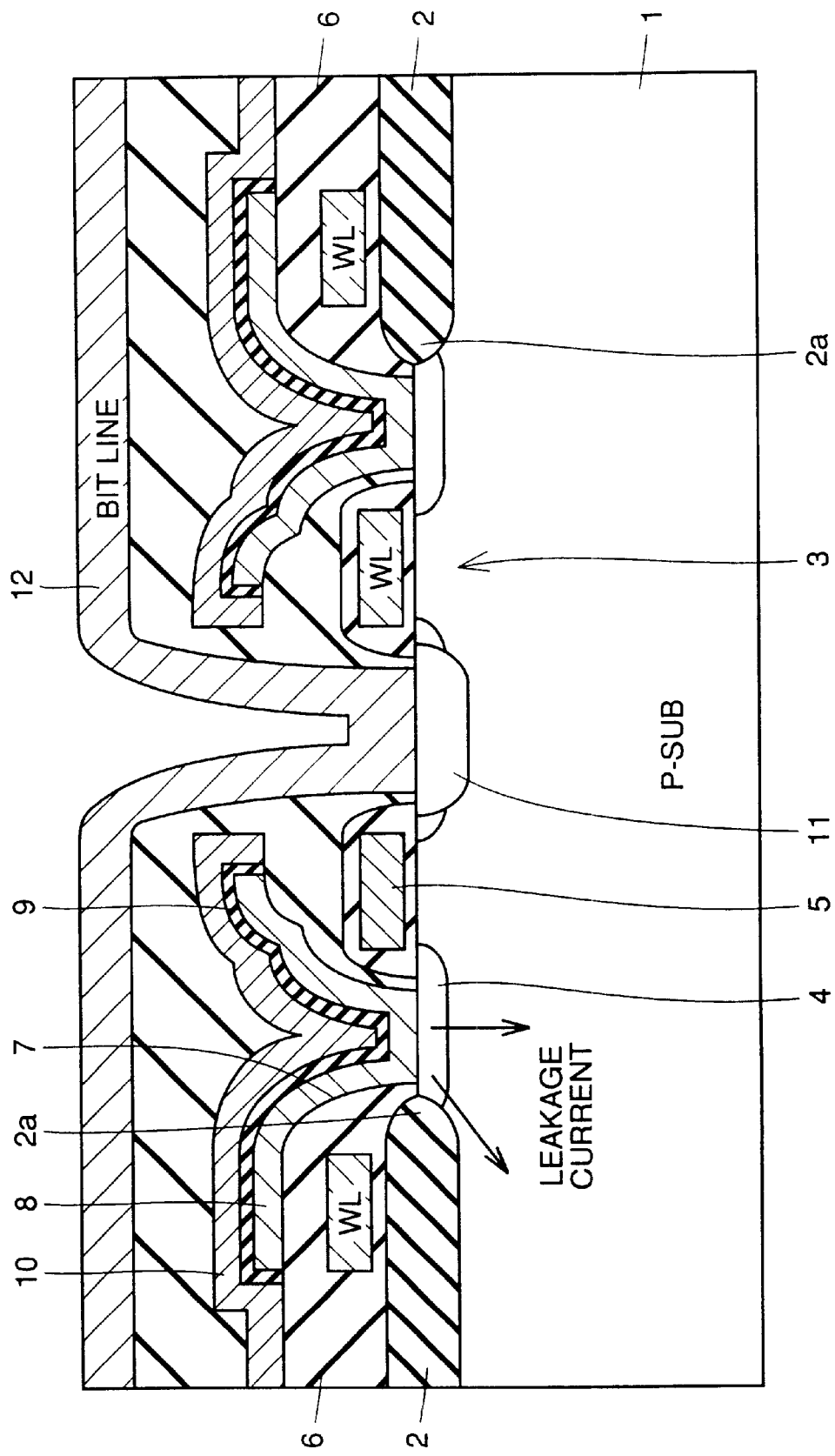
FIG. 54 is a sectional view of the conventional DRAM.
Figure 55:
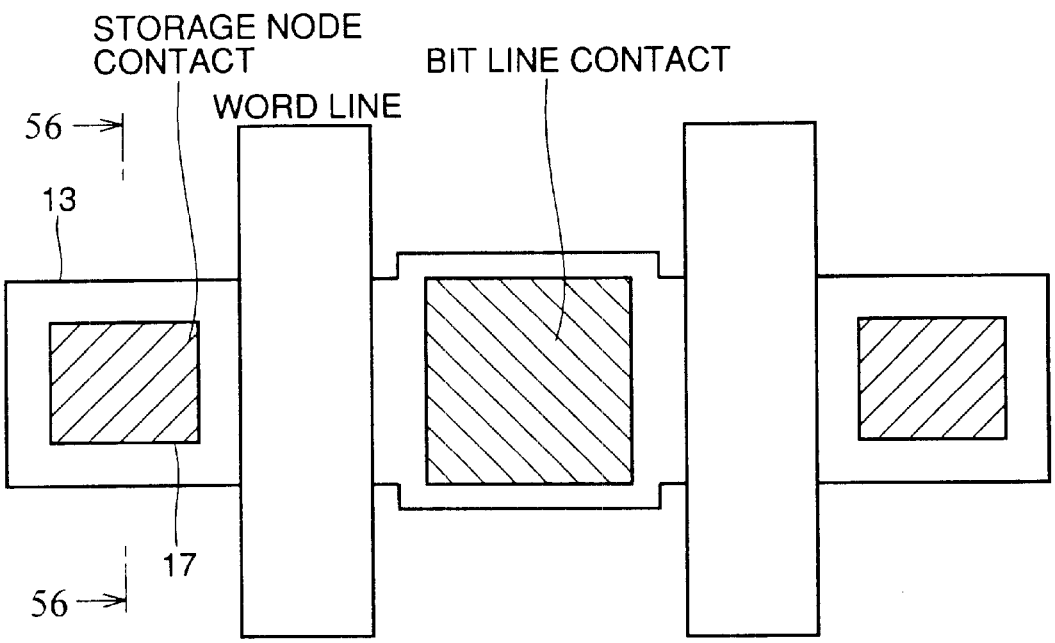
FIG. 55 is a layout diagram of the conventional DRAM.
Figure 56:
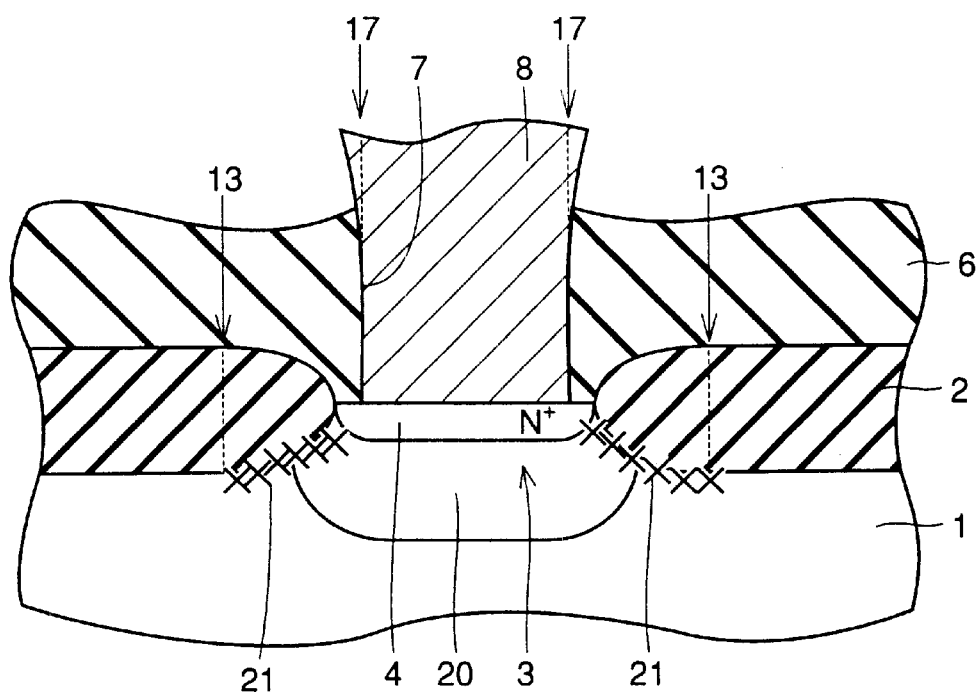
FIG. 56 is a sectional view of a DRAM taken in the same direction as that of the line 56—56 in FIG. 55.

Referring to FIG. 51, gate insulating film 33 and gate electrode 5 are formed on active region 3. Active layers 4 are formed on both sides of gate electrode 5 in the surface of active region 3. Interlayer insulating film 6 is formed on silicon substrate 1 so as to cover gate electrode 5. Contact hole 7 exposing the surface of active layer 4 is formed in interlayer insulating film 6. Contact hole 7 is filled with storage node 8 connected to active layer 4.

According to this embodiment, since the insulating film for isolating active region 3 from other active regions is formed of oxide film 40 with low stress, no defect is generated directly under the insulating film.

According to the semiconductor device of the first aspect of the present invention, the end portion of the field oxide film has a surface perpendicular with respect to the surface of the semiconductor device. Such a structure is obtained by etching away the end portion of the field oxide film in the direction perpendicular to the surface of the semiconductor substrate. By this etching, the end portion of the field oxide film is removed, and simultaneously, many of the defects which exist directly under the end portion of the field oxide film are removed. As a result, since the number of defects increasing leakage current is decreased, leakage current is reduced.

According to the semiconductor device of the second aspect of the present invention, the active layer is formed apart from the end portion of the field oxide film so as not to be in contact therewith. Therefore, the active layer does not come in contact with the defects which exist directly under the end portion of the field oxide film. As a result, leakage current is decreased.

According to the semiconductor device of the third aspect of the present invention, since the insulating film for isolating an active region from other active regions is formed with a chemical vapor deposition method, less stress is applied to the substrate. Therefore, no defect is generated directly under the insulating film. As a result, a semiconductor device with less leakage current can be obtained.

According to the method of manufacturing a semiconductor device of the fourth aspect of the present invention, the end portion of the field oxide film is simultaneously etched away with formation of the contact hole in the interlayer insulating film. When the end portion of the field oxide film is etched away, many of the defects which exist directly under the end portion of the field oxide film are removed. As a result, a semiconductor device with less leakage current can be obtained.

According to the method of manufacturing a semiconductor device of the fifth aspect of the present invention, many of the defects which exist directly under the end portion of the field oxide film are simultaneously removed when the end portion of the field oxide film is etched away. As a result, a semiconductor device with less leakage current can be obtained.

According to the method of manufacturing a semiconductor device of the six aspect of the present invention, the recessed portion is formed in a portion other than the active region. The recessed portion is filled with the insulating film. The active region is isolated from other active regions by the insulating film filling the recessed portion. Since no stress is applied to the semiconductor substrate when the recessed portion is filled with the insulating film, no defect is generated under the insulating film. As a result, a semiconductor device with less leakage current can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device including a first transistor having a first gate electrode and a second transistor having a second gate electrode, said semiconductor device being improved so that leak current at a first source/drain portion of said first transistor and at a second source/drain portion of said second transistor can be suppressed, said method comprising the steps of:

forming an isolation film having a bottom in a main surface of a semiconductor substrate;

forming, on said semiconductor substrate, said first gate electrode extending in a first direction, and said second gate electrode located apart from said first gate electrode, and extending in said first direction;

forming an interlayer insulating film on said semiconductor substrate so as to cover said isolation film, said first gate electrode and said second gate electrode;

forming a first contact hole by removing a portion of said interlayer insulating film and a portion of said isolation film so as to expose one of said first source/drain regions of said first transistor located at an opposite side to the side where said second gate electrode is present, whereby the main surface of said semiconductor substrate is located at the bottom of said isolation film and is recessed downwards at a region where said isolation film is partially removed;

forming a second contact hole by removing a portion of said interlayer insulating film and a portion of said isolation film so as to expose one of said second source/drain regions of said second transistor located at an opposite side to the side where said first transistor is present;

filling said first contact hole with a first conductor such that said first conductor comes into contact with a surface of a portion recessed downwards at a bottom of said first contact hole; and filling said second contact hole with a second conductor such that said second conductor comes into contact with a surface of a portion recessed downwards at a bottom of said second contact hole.

* * * * *